(12) United States Patent  
Taya

(10) Patent No.: US 10,373,862 B2
(45) Date of Patent: Aug. 6, 2019

(54) SEMICONDUCTOR DEVICE

(71) Applicant: Synaptics Japan GK, Tokyo (JP)

(72) Inventor: Masatoshi Taya, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 48 days.

(21) Appl. No.: 15/220,489

(22) Filed: Jul. 27, 2016

(65) Prior Publication Data

US 2017/0032999 A1 Feb. 2, 2017

(30) Foreign Application Priority Data

Jul. 31, 2015 (JP) .................. 2015-151973

(51) Int. Cl.
| | |
|---|---|
| *H01L 29/423* | (2006.01) |
| *H01L 29/78* | (2006.01) |
| *H01L 21/765* | (2006.01) |
| *H01L 27/088* | (2006.01) |
| *H01L 29/06* | (2006.01) |
| *H01L 29/08* | (2006.01) |
| H01L 27/092 | (2006.01) |
| H01L 21/8234 | (2006.01) |

(52) U.S. Cl.
CPC .......... *H01L 21/765* (2013.01); *H01L 27/088* (2013.01); *H01L 29/0692* (2013.01); *H01L 29/0847* (2013.01); *H01L 29/42356* (2013.01); *H01L 21/823481* (2013.01); *H01L 27/0922* (2013.01)

(58) Field of Classification Search
CPC ......... H01L 29/42372; H01L 29/42376; H01L 29/4238
See application file for complete search history.

(56) References Cited

U.S. PATENT DOCUMENTS

2009/0224335 A1* 9/2009 Chang ................. H01L 29/7833
257/396
2013/0140632 A1* 6/2013 Landgraf .......... H01L 21/02107
257/335

FOREIGN PATENT DOCUMENTS

JP 2001144189 A 5/2001

* cited by examiner

*Primary Examiner* — Sue A Purvis
*Assistant Examiner* — Scott Stowe
(74) *Attorney, Agent, or Firm* — Patterson + Sheridan, LLP

(57) ABSTRACT

Provided is a semiconductor device including an active region defined by a separation region on a main surface of a semiconductor substrate, and a field effect transistor formed in the active region. A boundary portion, over which a gate electrode pattern strides, is disposed in a boundary between the active region and the separation region and is configured such that a length of one side, in a direction of a gate length of the field effect transistor formed in the active region, becomes larger than the gate length and does not come into contact with at least one of a pair of source and drain regions of the field effect transistor.

14 Claims, 50 Drawing Sheets

CROSS-SECTION X-X'

SEMICONDUCTOR DEVICE

CROSS-REFERENCE TO RELATED APPLICATIONS

The Present application claims priority to Japanese application JP 2015-151973, filed on Jul. 31, 2015, the content of which is hereby incorporated by reference into this application.

TECHNICAL FIELD

The invention relates to a semiconductor device including a field effect transistor, and particularly relates to a technique for suppressing a kink current.

BACKGROUND

There is a phenomenon of an undesirable flow of a drain current in a field effect transistor even when a gate voltage is set to be equal to or lower than a threshold voltage. For example, due to distortion or a crystal defect in a boundary portion between an active region and a separation region of a field effect transistor, a drain current starts to flow along the boundary portion even at a gate voltage equal to or lower than a threshold voltage. Thus, there is an undesired variation in a current between field effect transistors constituting a differential pair, a load and the like in which a current balance is required. For example, JP-A-2001-144189 discloses that when a field effect transistor is formed in an element region partitioned by a trench element separation region, impurity concentration is adjusted so that a threshold voltage between both ends in the vicinity of a boundary with the trench element separation region is made to be higher than that in the central portion of its channel region.

SUMMARY

In an embodiment, a semiconductor device includes an active region defined by a separation region on a main surface of a semiconductor substrate; and a field effect transistor formed in the active region, wherein a boundary portion, over which a gate electrode pattern strides, is disposed in a boundary between the active region and the separation region, the field effect transistor including source and drain regions and a channel region interposed inside the boundary at least in a direction of a gate width, a separation portion separating the source and drain regions from the boundary portion.

In another embodiment, a semiconductor device includes an active region defined by a separation region on a main surface of a semiconductor substrate; and a field effect transistor formed in the active region, wherein a boundary portion, over which a gate electrode pattern strides, is disposed in a boundary between the active region and the separation region and is configured such that a length of one side, in a direction of a gate length of the field effect transistor formed in the active region, becomes larger than the gate length and does not come into contact with at least one of a pair of source and drain regions of the field effect transistor.

In another embodiment, a semiconductor device includes an active region defined by a separation region on a main surface of a semiconductor substrate; and a field effect transistor formed in the active region, wherein a boundary portion, over which a gate electrode pattern strides, is disposed in a boundary between the active region and the separation region and comes into contact with both of a pair of source and drain regions of the field effect transistor formed in the active region, a non-contact length of the boundary portion, not in contact with the source and drain regions and between a first part of the boundary portion that comes into contact with one of the source and drain regions and a second part of the boundary port ion that comes into contact with the other source and drain region, becomes larger than a gate length of the field effect transistor.

DETAILED DESCRIPTION

Figure 1:
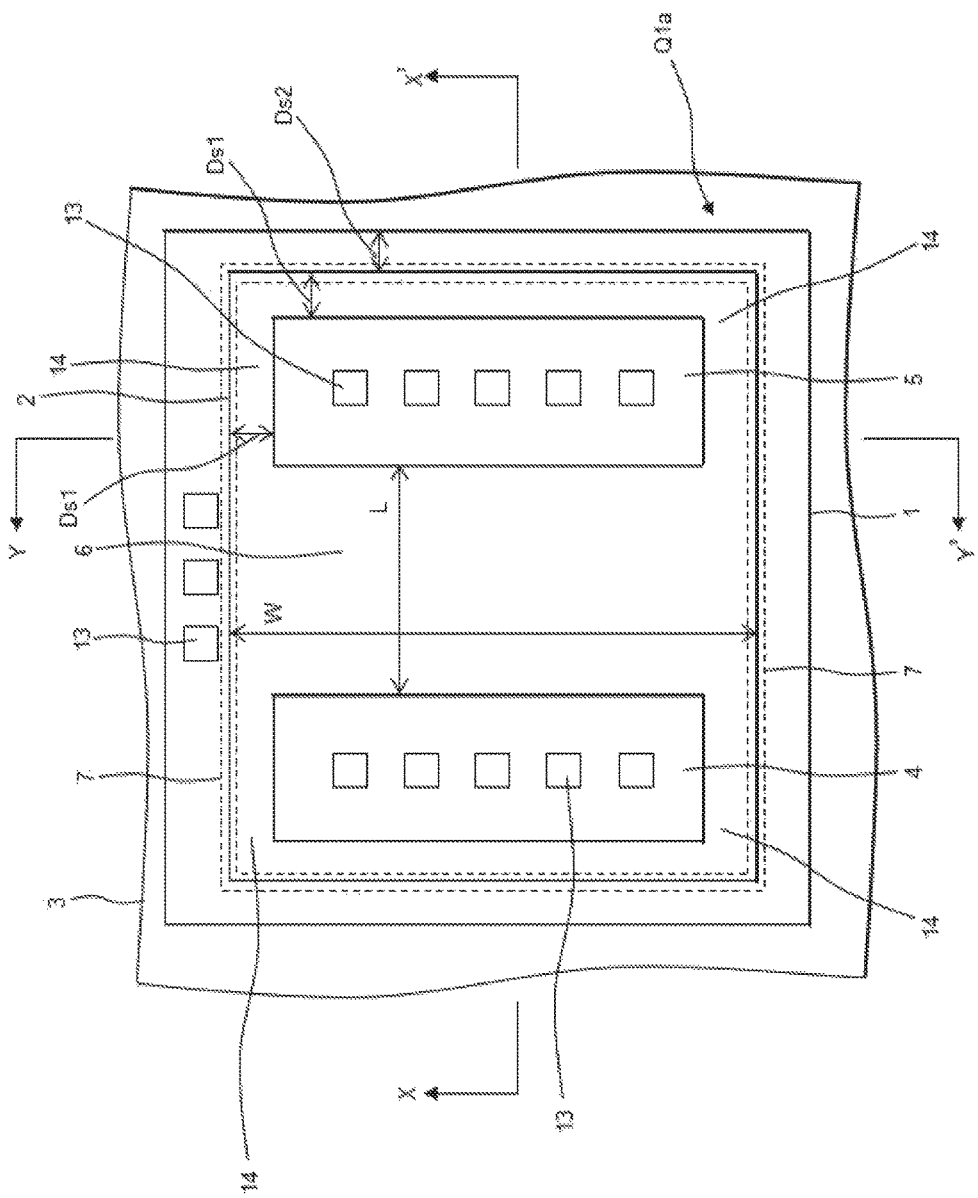
FIG. 1 is a plan view illustrating a first example of a planar layout configuration of a field effect transistor included in a semiconductor device according to the invention.

The inventor has examined the suppression of an off-state current as described above. According to this, for example, in a process in which a low-voltage field effect transistor having an operating voltage of approximately 1 V to 2 V and a medium-voltage field effect transistor having an operating voltage of 5V to 8V are mixed into the same chip, it has been found that there is a problem of a kink phenomenon having a tendency to be caused in the I-V waveform of the medium-voltage field effect transistor. An I-V waveform having the kink phenomenon caused therein contains a source-to-drain current component starting to flow from a step in which a gate voltage is lower than a threshold voltage as compared to a normal I-V waveform, and is coincident with a normal waveform when the gate voltage becomes higher. A waveform having a difference in step caused in this manner is generally called a kink waveform. Since a variation is present in the degree of occurrence of such a kink phenomenon, two problems occur mainly. A first problem is that an off-leak current (Ioff) increases. A second problem is that in case that a pair of low current values are taken in an analog circuit, a drain current varies between field effect transistors adjacent to each other due to the kink phenomenon, which leads to a deterioration in pair accuracy.

The causes of bringing about such a kink phenomenon include two cases to be considered. A first case is generally often caused by thinning in which the thickness of a gate oxide film of a medium-voltage field effect transistor is partially reduced. In the general layout of a field effect transistor, a gate electrode runs straight to an active region when seen in a plan view, and both ends of the gate electrode in the direction of a gate width protrude to a separation region. One of the active regions with the gate electrode interposed therebetween serves as a drain electrode, and the other active region serves as a source electrode. A region in which the gate electrode and the active region overlap each other serves as a channel region, a gap between the drain electrode and the source electrode serves as a gate length, and the width of a region in a direction perpendicular to this gate length serves as a gate width. Here, a place where the gate electrode strides over a boundary between the active region and the separation region serves as a boundary region between the channel region and the separation region, and a problem of thinning in which the thickness of a gate oxide film is partially reduced in this portion has a tendency to occur. In this manner, in the boundary region where the thickness of the gate oxide film is reduced, the threshold voltage of the field effect transistor becomes lower, and a side channel is formed. A drain-to-source current starts to flow to the side channel at a gate voltage lower than an original threshold voltage, and this current appears as a kink waveform.

A second case is that a kink waveform is caused even in case that thinning is not present in the thickness of the gate oxide film. There is a structure in which the thickness of the gate oxide film is not thinned even at the channel end. Generally, since the separation region is formed and then the gate oxide film is formed, thinning has a tendency to be caused to occur at the end. However, since the gate oxide film is uniformly formed in advance and then the separation region such as a shallow trench isolation (STI) is formed, thinning is not caused. However, impurity concentration decreases (lowers) in the region of the channel end due to a process at the time of the STI formation. As a result, a side channel having a low threshold voltage is generated in the same region as that of thinning, and thus a kink current is generated in the same path as the similar side channel.

Underlying causes are different from each other as seen from the above, but a current component through the side channel having a low threshold voltage occurring in the end of the channel region of the field effect transistor of a medium voltage or the like in the direction of a channel width generates a kink waveform.

In the technique of JP-A-2001-144189, the number of manufacturing processes has to be increased by adding a photomask for implanting an impurity at high concentration in association with the position of the side channel in order to suppress the generation of a kink current.

An embodiment of the invention provides a semiconductor device capable of suppressing the generation of a kink current without increasing the number of impurity implantation processes or the number of photomasks.

The above and other embodiments and novel features of the invention will be made clearer from the description and the accompanying drawings of the present specification.

The following is a brief description of the summary of the representative embodiments of the invention disclosed in the present application. Meanwhile, reference numerals and signs within the drawings and the like which are written in parentheses in the present items are an example for making the content easier to understand.

[1] Boundary Portion has Source and Drain Regions and Channel Region Interposed Therein in Direction of Gate Width, and Interposed Source and Drain Regions are Separated from Boundary Portion in Direction of Gate Width A semiconductor device includes an active region (2) defined by a separation region (3) on a main surface of a semiconductor substrate, and a field effect transistor (Q1a to Q1c, Q2a to Q2e, Q3a to Q3d) formed in the active region. A boundary portion (7), over which a gate electrode pattern strides, is disposed in a boundary between the active region and the separation region. The field effect transistor has source and drain regions (4, 5) and a channel region (6) formed in the active region and interposed inside the boundary portion at least in a direction of a gate width (W). A separation portion (14) separates the source and drain regions from the boundary portion having the source, drain, and channel regions interposed therein the direction of the gate width.

According to this, the boundary portion is separated from the source and drain regions by the separation portion, and thus the boundary portion and the source and drain regions not come into contact with each other in a portion having the separation portion interposed therein even in case that the thickness of a gate oxide film is reduced in the boundary portion and impurity concentration becomes lower. Therefore, in case that the boundary portion does not come into contact with both the source and drain regions of the field effect transistor, the boundary portion does not constitute a side channel for causing a current to flow from one source and drain region to the other source and drain region. In case that the boundary portion comes into contact with both the source and drain regions of the field effect transistor, the side channel for causing the undesired current to flow is constituted, but the current path becomes larger than the channel length of the field effect transistor by the interposition of the separation portion, and thus the degree of the undesired current can be alleviated by an undesired increase in the current path. In this manner, it is possible to suppress the generation of a kink current through the layout of the gate electrode pattern without increasing the number of impurity implantation processes or the number of photomasks. Further, the structure of the boundary portion having the source and drain regions and the channel region interposed therein in the direction of the gate width implicitly means the capability of using the gate electrode pattern as a mask when an impurity is implanted into the source and drain regions.

[2] Boundary Portion does not Come into Contact with at Least One of a Pair of Source and Drain Regions of Field Effect Transistor In item 1, the boundary portion covered with the gate electrode pattern does not come into contact with at least one of a pair of source and drain regions of the field effect transistor formed in the active region (Q1a to Q1c, Q2a to Q2e).

According to this, the boundary portion does not come into contact with at least one of the source and drain regions of the field effect transistor, and thus the boundary portion does not constitute a side channel for causing a current to flow from one source and drain region to the other source and drain region.

[3] Boundary Portion Surrounds Both Source and Drain Regions when Seen in Plan View (does not Come into Contact with Both Regions)

In item 2, the boundary portion covered with the gate electrode pattern surrounds each of the source and drain regions and the channel region of the field effect transistor formed in the active region from four directions when seen in a plan view, and does not come into contact with each of the source and drain regions (Q1a to Q1c).

According to this, the boundary portion does not come into contact with both the source and drain regions of the field effect transistor, and thus the boundary portion does not constitute a side channel for causing a current to flow from one source and drain region to the other source and drain region. The reliability of the effect of suppressing a kink current is improved. However, the areas of the active region and the gate electrode pattern become larger.

[4] Source and Drain Regions Surrounded by Boundary Portion are Used in Common in a Portion of MOSs Adjacent to Each Other In item 3, the boundary portion surrounds a plurality of field effect transistors, and a portion of each of surrounded source and drain regions is made to be common between field effect transistors (Q1b, Q1c) adjacent to each other.

According to this, it is possible to contribute to a reduction in the chip occupied area of two field effect transistors in which a gate is used in common and either of a source or a drain is used in common. For example, it is possible to make an application to a current mirror load or the like in which a gate of two field effect transistors is connected in common, and the source thereof is connected in common.

[5] Boundary Portion has any One of Source and Drain Regions and Channel Region Interposed Therein from Direction of Gate Width when Seen in Plan View (does not Come into Contact with One Region)

In item 2, the boundary portion comes into contact with one source and drain region of the field effect transistor formed in the active region and surrounds the other source and drain region and the channel region from three directions when seen in a plan view, and the other source and drain region does not come into contact with the boundary portion (Q2a, Q2d, Q2e).

According to this, the chip occupied areas of the active region and the gate electrode pattern can be reduced on one source and drain region side that comes into contact with the boundary portion as compared to the structures (Q1a to Q1c) of items 3 and 4.

[6] Source and Drain Regions Interposed in Boundary Portion are Individualized Between MOSs Adjacent to Each Other In item 5, in a state where two of the field effect transistors are set to one unit, each of the source and drain regions on one side is used in common, and each of the source and drain regions on the other side is individualized (Q2d, Q2e).

According to this, it is possible to contribute to a reduction in the chip occupied area of two field effect transistors in which either of a source or a drain is used in common. For example, it is possible to make an application to a differential input circuit or the like in which the source of two field effect transistors is connected in common, and the drain and gate thereof are individualized.

[7] Source and Drain Regions Interposed in Boundary Portion are Used in Common Between MOSs Adjacent to Each Other In item 5, the gate electrode pattern striding over the boundary portion is shared by two field effect transistors adjacent to each other, the two field effect transistors share the other source and drain region, and the boundary portion has the shared source and drain region and each channel region interposed therein in the direction of the gate width (Q2b, Q2c).

According to this, it is possible to contribute to a reduction in the chip occupied area of two field effect transistors in which a gate is used in common and either of a source or a drain is used in common. For example, it is possible to make an application to a current mirror load or the like in which a gate of two field effect transistors is connected in common, and the source thereof is connected in common. Particularly, the chip occupied areas of the active region and the gate electrode pattern can be reduced on one source and drain region side that comes into contact with the boundary portion as compared to the structure (Q1b, Q1c) of item 4.

[8] Non-Contact Length from Boundary Portion that Comes into Contact with One Source and Drain Region to Boundary Portion that Comes into Contact with the Other Source and Drain Region is Larger than Gate Length of the Field Effect Transistor In item 1, the boundary portion over which the gate electrode pattern strides comes into contact with both of a pair of source and drain regions of the field effect transistor formed in the active region, one source and drain region (5) has the separation portion (14) formed between the boundary portion (7) and the region, and a length of the boundary portion from a position at which the boundary portion and the one source and drain region (5) come into contact with each other to a position at which the boundary portion comes into contact with the other source and drain region (4) through the separation portion (14) is larger than a gate length (L) of the field effect transistor (Q3a to Q3d).

According to this, in case that the boundary portion comes into contact with both the source and drain regions of the field effect transistor, the boundary portion constitutes a side channel for causing a current to flow from one source and drain region to the other source and drain region, but the current path becomes larger than the channel length of the field effect transistor by the interposition of the separation portion (14), and thus the degree of the undesired current can be alleviated by an undesired increase in the current path.

[9] Boundary Portion has any One of Source and Drain Regions and Channel Region Interposed Therein in Direction of Gate Width when Seen in Plan View In item 8, a length of the one source and drain region (5) in the direction of the gate width becomes smaller than a length of the other source and drain region in the direction of the gate width, and the boundary portion covered with the gate electrode pattern has the one source and drain region (5) and the channel region (6) of the field effect transistor, formed in the active region, interposed therein in the direction of the gate width (Q3a).

According to this, since the active region may not be formed exceeding the source and drain regions in the direction of the gate length, and the gate electrode pattern is not required to be expanded, the chip areas thereof can be made smaller than that of the structure (Q2a) of item 5.

[10] Source and Drain Regions Interposed in Boundary Portion are Individualized Between Field Effect Transistors Adjacent to Each Other In item 9, in a state where two of the field effect transistors are set to one unit, each of the source and drain regions on the other side is used in common, and each of the source and drain regions on one side is individualized (Q3b, Q3c).

According to this, it is possible to contribute to a reduction in the chip occupied area of two field effect transistors in which either of a source or a drain is used in common. For example, it is possible to make an application to a differential input circuit or the like in which the source of two field effect transistors is connected in common, and the drain and gate thereof are individualized.

[11] Boundary Portion has Both Source and Drain Regions and Channel Region Interposed Therein in Direction of Gate Width when Seen in Plan View In item 8, each of the source and drain regions of the field effect transistor includes the separation portion between the boundary portion and the region, and the boundary portion has both of the source and drain regions and the channel region interposed therein in the direction of the gate width (Q3d).

According to this, since the length of non-contact of the boundary portion with the source and drain regions becomes larger than that of the structure (Q3a) of item 9, the degree of a current undesirably flowing through a side channel of boundary portion can be further alleviated to that extent.

[12] Boundary Portion does not Come into Contact with at Least One of Source and Drain Regions of Field Effect Transistor A semiconductor device includes an active region defined by a separation region on a main surface of a semiconductor substrate, and a field effect transistor (Q1a to Q1c, Q2a to Q2e) formed in the active region. A boundary portion (7), over which a gate electrode pattern strides, is disposed in a boundary between the active region (2) and the separation region (3) and is configured such that a length of one side, in a direction of a gate length of the field effect transistor formed in the active region, becomes larger than the gate length and does not come into contact with at least one of a pair of source and drain regions of the field effect transistor According to this, the boundary portion does not come into contact with at least one of a pair of source and drain regions. Therefore, even in case that the thickness of a gate oxide film is reduced in the boundary portion, and impurity concentration becomes lower, the boundary portion does not substantially constitute a side channel for causing a current to flow from one source and drain region to the other source and drain region, thereby allowing the generation of a kink current to be suppressed. The non-contact of the boundary portion with at least one of the source and drain regions can be realized by a structure in which the length of one side of the boundary portion in the direction of the gate length of the field effect transistor becomes larger than the gate length, and thus it is possible to suppress the generation of a kink current through the layout of the gate electrode pattern without increasing the number of impurity implantation processes or the number of photomasks.

[13] Boundary Portion does not Come into Contact with Both Source and Drain Regions when Seen in Plan View In item 12, the boundary portion is separated from both the source and drain regions of the field effect transistor formed in the active region (Q1a to Q1c).

According to this, the reliability of the effect of suppressing a kink current is improved.

[14] A Portion of Source and Drain Regions Surrounded by Boundary Portion is Used in Common Between Field Effect Transistors Adjacent to Each Other In item 13, the field effect transistor is adjacent formed in the active region relating to the boundary portion by using a portion of the source and drain regions and the gate electrode pattern in common (Q1b, Q1c).

According to this, it is possible to contribute to a reduction in the chip occupied area of two field effect transistors in which a gate is used in common and either of a source or a drain is used in common. For example, it is possible to make an application to a current mirror load or the like in which a gate of two field effect transistors is connected in common, and the source thereof is connected in common.

[15] Boundary Portion does not Come into Contact with One Source and Drain Region when Seen in Plan View In item 12, the boundary portion comes into contact with one source and drain region of the field effect transistor formed in the active region, and is separated from the other source and drain region (Q2a, Q2d, Q2e).

According to this, the chip occupied areas of the active region and the gate electrode pattern can be reduced on one source and drain region side that comes into contact with the boundary portion as compared to the structures (Q1a to Q1c) of items 13 and 14.

[16] Source and Drain Regions Interposed in Boundary Portion are Used in Common Between Field Effect Transistors Adjacent to Each Other In item 15, the gate electrode pattern over striding the boundary portion is shared by two field effect transistors adjacent to each other, and the two field effect transistors share the other source and drain region (Q2b, Q2c).

According to this, it is possible to contribute to a reduction in the chip occupied area of two field effect transistors in which a gate is used in common and either of a source or a drain is used in common. For example, it is possible to make an application to a current mirror load or the like in which a gate of two field effect transistors is connected in common, and the source thereof is connected in common. Particularly, the chip areas of the active region and the gate electrode pattern can be reduced on one source and drain region side that comes into contact with the boundary portion as compared to the structure (Q1b, Q1c) of item 14.

[17] Source and Drain Regions Interposed in Boundary Portion are Individualized Between Field Effect Transistors Adjacent to Each Other In item 15, in a state where two of the field effect transistors are set to one unit, each of the source and drain regions on one side is used in common (Q2d, Q2e).

According to this, it is possible to contribute to a reduction in the chip occupied area of two field effect transistors in which either of a source or a drain is used in common. For example, it is possible to make an application to a differential input circuit or the like in which the source of two field effect transistors is connected in common, and the drain and gate thereof are individualized.

[18] Non-Contact Length from Boundary Portion that Comes into Contact with One Source and Drain Region to Boundary Portion that Comes into Contact with the Other Source and Drain Region is Larger than Gate Length of the Field Effect Transistor A semiconductor device includes an active region (2) defined by a separation region (3) on a main surface of a semiconductor substrate, and a field effect transistor formed in the active region. A boundary portion, over which a gate electrode pattern strides, is disposed in a boundary between the active region (2) and the separation region (3) and comes into contact with both of a pair of source and drain regions (4,5) of the field effect transistor formed in the active region. A non-contact length of the boundary portion, not being in contact with the source and drain regions, between a first part of the boundary portion coming into contact with the one source and drain region (5) and a second part of the boundary portion coming into contact with the other source and drain region (4), becomes larger than a gate length (L) of the field effect transistor.

According to this, in case that the boundary portion comes into contact with both the source and drain regions of the field effect transistor, the boundary portion constitutes a side channel for causing a current to flow from one source and drain region to the other source and drain region, but the current path is larger than the channel length of the field effect transistor, and thus the degree of the undesired current can be alleviated by an undesired increase in the current path.

[19] Length of One Source and Drain Region in Direction of Gate Width is Reduced when Seen in Plan View In item 18, a length of the one source and drain region in the direction of the gate width becomes smaller than a length of the other source and drain region in the direction of the gate width. The one source and drain region comes into contact with the boundary portion through a separation portion which is separated from the boundary portion (Q3a).

According to this, since the active region may not be formed exceeding the source and drain regions in the direction of the gate length, and the gate electrode pattern is not required to be expanded, the chip areas thereof can be made smaller than that of the structure (Q2a) of item 15.

[20] Source and Drain Regions Reduced in Length in Direction of Gate Width are Individualized Between Field Effect Transistors Adjacent to Each Other In item 19, in a state where two of the field effect transistors are set to one unit, each of the source and drain regions on the other side is used in common, and each of the source and drain regions on one side is individualized (Q3b, Q3c).

According to this, it is possible to contribute to a reduction in the chip occupied area of two field effect transistors in which either of a source or a drain is used in common. For example, it is possible to make an application to a differential input circuit or the like in which a source of two field effect transistors is connected in common and the gate thereof is individualized.

[21] Boundary Portion has Both Source and Drain Regions and Channel Region Interposed Therein in Direction of Gate Width when Seen in Plan View In item 18, each of the source and drain regions of the field effect transistor comes into contact with the boundary portion through the separation portion which is separated from the boundary portion (Q3d).

According to this, since the length of non-contact of the boundary portion with the source and drain regions becomes larger than that of the structure (Q3a) of item 19, the degree of a current undesirably flowing through a side channel of boundary portion can be further alleviated to that extent.

The following is a brief description of an effect obtained by the representative embodiments of the invention disclosed in the present application.

That is, it is possible to suppress the generation of a kink current through the layout of the gate electrode pattern without increasing the number of impurity implantation processes or the number of photomasks.

Boundary Portion Does Not Come into Contact with Both Source and Drain Regions

Figure 2:
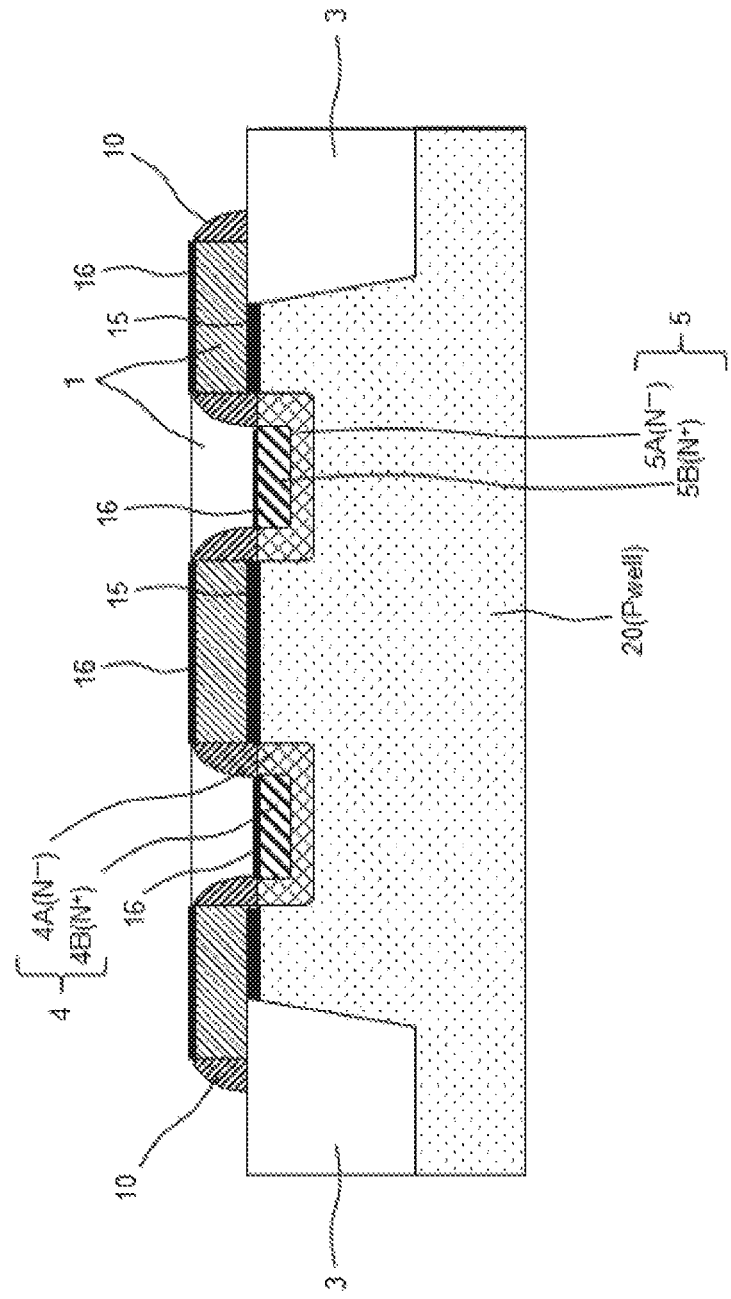
FIG. 2 is a cross-sectional view taken along line X-X' of FIG. 1.

FIG. 1 shows a first example of a planar layout configuration of a field effect transistor included in a semiconductor device according to the invention. FIG. 2 shows a cross-section X-X' of FIG. 1, and FIG. 3 shows across-section Y-Y' of FIG. 1.

The semiconductor device includes a plurality of wells, electrically separated from each other by a separation portion, on a main surface of a semiconductor substrate (not shown), and has multiple types of field effect transistors (hereinafter, also simply referred to as MOS transistors) according to multiple types of withstand voltages such as a medium voltage and a low voltage and conductivity types formed in respective corresponding wells. For example, a separation portion that specifies an active region for forming an element such as a MOS transistor is formed on a p-type semiconductor substrate (not shown). In addition, in the semiconductor substrate, an n-channel type field effect transistor (n channel MOS transistor) having an n-type well or a p-type well for using as an active region formed therein is formed in a p-type well, and a p-channel type field effect transistor (p channel MOS transistor) is formed in an n-type well.

Figure 3:
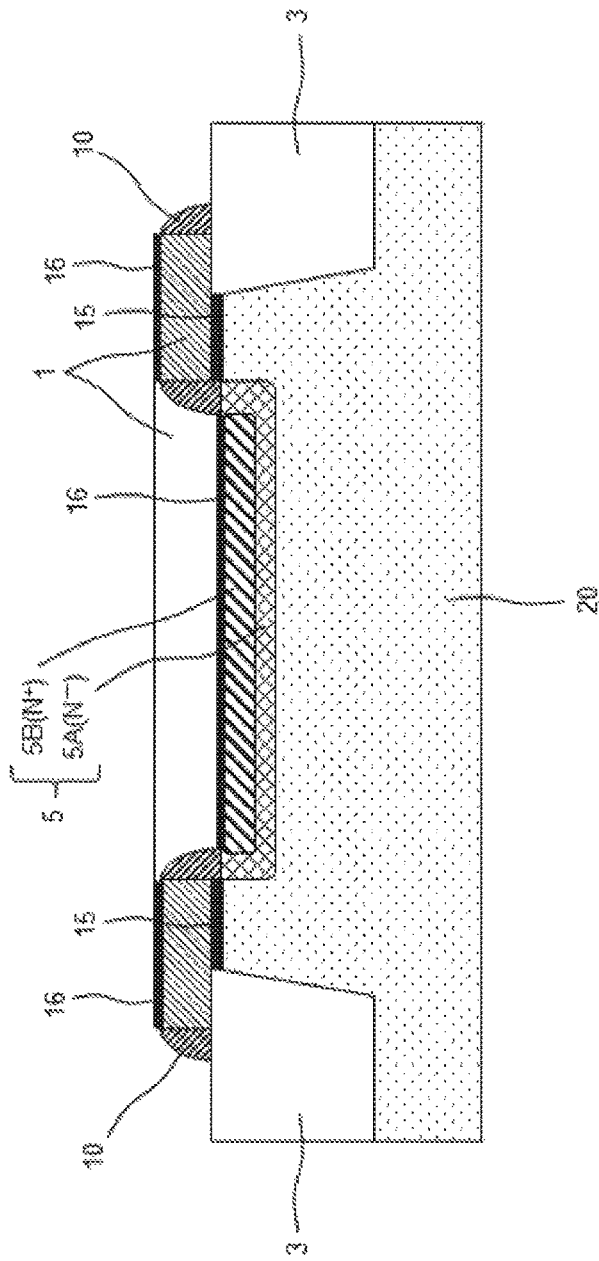
FIG. 3 is a cross-sectional view taken along line Y-Y' of FIG. 3.

FIGS. 1 to 3 illustrate an n-channel type MOS transistor Q1a as one MOS transistor. Herein, an active region 2 is defined by a p-type well 20 which is electrically separated by a separation portion 3. An impurity such as, for example, boron (B) indicating a p-type is contained in the p-type well 20. The separation portion 3 is formed by an insulating layer being embedded in, for example, a groove. The MOS transistor Q1a is formed in this active region 2. The MOS transistor Q1a includes a gate electrode pattern 1, a gate insulating film 15, n-type source and drain regions 4 and 5, and the p-type well 20. The gate insulating film 15 is formed of, for example, a silicon oxide, and has a film thickness required for realizing a necessary withstand voltage. The gate insulating film 15 may be generated by laminating an insulating film deposited a CVD method or the like in addition to thermal oxidation.

A pair of n-type source and drain regions 4 and 5 of the MOS transistor Q1a are formed so as to be separated from each other within the p-type well 20, and a region located therebetween serves as a channel region 6. As shown in FIG. 2, the n-type source and drain regions 4 and 5 include $n^-$-type semiconductor regions 4A and 5A, and $n^+$-type semiconductor regions 4B and 5B which are electrically connected to the semiconductor regions 4A and 5A. The $n^-$-type semiconductor regions 4A and 5A and the $n^+$-type semiconductor regions 4B and 5B contain the same conductivity type impurity such as, for example, phosphorus (P), but the impurity concentration of the $n^+$-type semiconductor regions 4B and 5B is set so as to become higher than the impurity concentration of the $n^-$-type semiconductor regions 4A and 5A. The source and drain regions 4 and 5 are electrically connected to an interconnect layer through a conductor portion within a contact hole (not shown). A silicide layer 16 may be formed on the surface layer of the $n^+$-type semiconductor regions 4B and 5B with which the conductor portion comes into contact. The reference number 10 is a sidewall spacer. The silicide layer 16 may also be formed on the surface of the gate electrode pattern 1.

In case that attention is focused on the planar layout of the MOS transistor Q1a, as shown in FIG. 1, a boundary portion (portion surrounded by a broken line) 7 over which the gate electrode pattern 1 strides in a boundary between the active region 2 and the separation region 3 has the source and drain regions 4 and 5 and the channel region 6 of the MOS transistor Q1a, formed in the active region 2, interposed therein at least in the direction of a gate width W, and includes a separation portion 14 that separates the source and drain regions 4 and 5 from the boundary portion 7 having the regions interposed therein in the direction of the gate width W. More specifically, the boundary portion 7 covered with the gate electrode pattern 1 surrounds each of the source and drain regions 4 and 5 and the channel region 6 of a field effect transistor formed in the active region 2 from four directions when seen in a plan view, and does not come into contact with each of the source and drain regions 4 and 5. A distance between the source and drain regions 4 and 5 and the boundary portion 7 is set to Ds1. A protrusion distance by which the gate electrode pattern 1 protrudes outside of the boundary portion 7 is Ds2. In addition, as apparent from the planar shape of the gate electrode pattern 1 in which the gate electrode pattern 1 spreads outside of the boundary between the active region 2 and the separation portion 3, the gate electrode pattern 1 can be used in a mask when an impurity is implanted into the source and drain regions 4 and 5. Meanwhile, 13 means a conductor portion within a contact hole or a through hole for connection to an upper interconnect layer.

Figure 4:
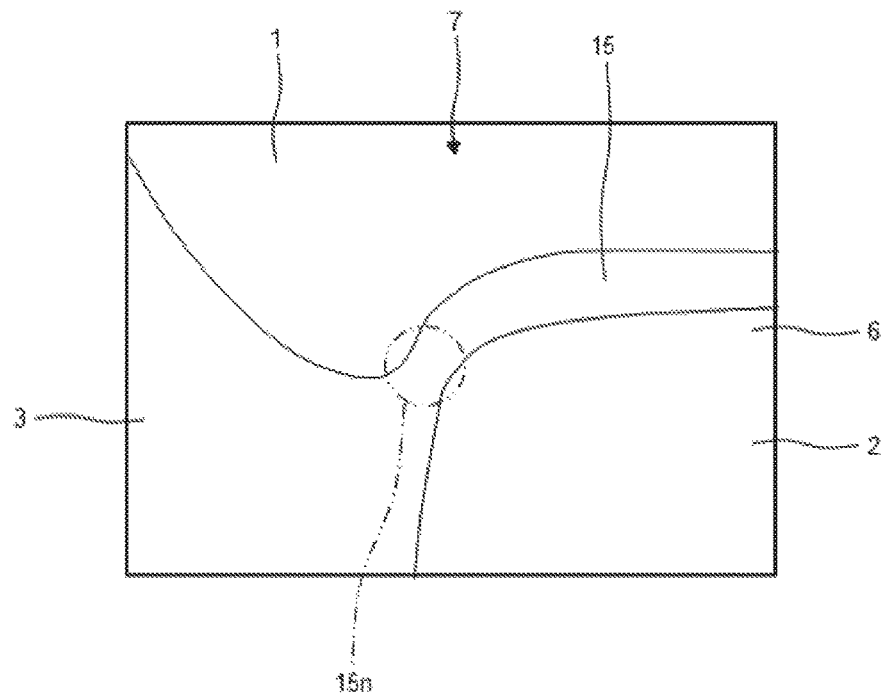
FIG. 4 is a diagram illustrating thinning in which the thickness of a gate oxide film is partially reduced.
Figure 5:
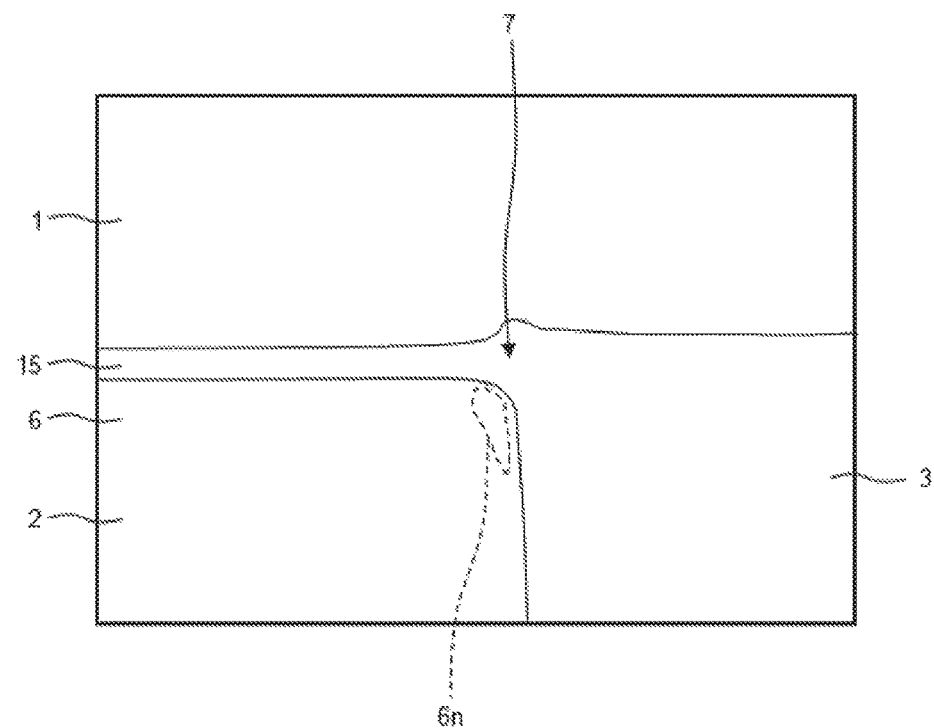
FIG. 5 is a diagram illustrating a point at which impurity concentration decreases (lowers) in an active region in the vicinity of a boundary portion in case that thinning is not caused to occur.

Here, as illustrated FIG. 4, a problem of thinning in which the thickness of the gate oxide film 15 is partially reduced has a tendency to occur in the vicinity of the boundary portion 7 in which the gate electrode 1 strides over the boundary between the active region 2 and the separation region 3, and the threshold voltage of a field effect transistor becomes lower in a portion 15n in the vicinity of the boundary portion 7 where the thickness of the gate oxide film is reduced in this manner. In addition, as shown in FIG. 5, in case that thinning is not caused to occur by forming a separation portion such as shallow trench isolation (STI) after the gate oxide film is first formed uniformly, impurity concentration decreases (lowers) in a channel region 6n in the vicinity of the boundary portion 7 due to a process at the time of the formation of STI, and a threshold voltage becomes lower in the portion likewise. These points are the same as those in the related art, but the boundary portion 7 does not come into contact with the source and drain regions 4 and 5, and thus a case does not occur in which a kink phenomenon is caused where a drain-to-source current starts to flow through the boundary portion 7 at a gate voltage lower than an original threshold voltage without constituting a side channel for causing the source and drain electrode 4 and the source and drain electrode 5 to allow electrical conduction to each other. In this manner, since the boundary portion 7 is separated from the source and drain electrodes 4 and 5 by the width Ds1 and an inversion does not start at a gate voltage lower than an original threshold voltage in the location of this width Ds1, a side channel for making a connection between a source and a drain is not formed, and a source-to-drain current does not flow. When an inversion starts in the channel region 6, an inversion also starts in the location of the width Ds1, and a current component through the boundary portion 7 flows between a source and a drain. However, since a current due to the channel region 6 also starts to flow simultaneously, a kink waveform is not formed in the entire MOS transistor Q1a. In this manner, it is possible to delay a current rise in a side channel by separating the source and drain regions 4 and 5 by the width Ds1 from the boundary portion 7 which may possibly cause the kink waveform, and to obtain I-V characteristics in which the kink waveform is not generated. Thereby, it is possible to reduce the off-leak of the MOS transistor Q1a. In addition, a kink component (current flowing undesirably due to the kink phenomenon) has a property of a random variation. Therefore, as described above, when there is no kink component, it is possible to improve the pair accuracy of the MOS transistor, and to reduce the size of the MOS transistor. Since a device structure for alleviating the aforementioned kink phenomenon does not influence a gate length and a gate width, the device characteristics do not change greatly from the characteristics of an existing simulation model having the same gate length and gate width as that, and a design is also facilitated.

Figure 6:
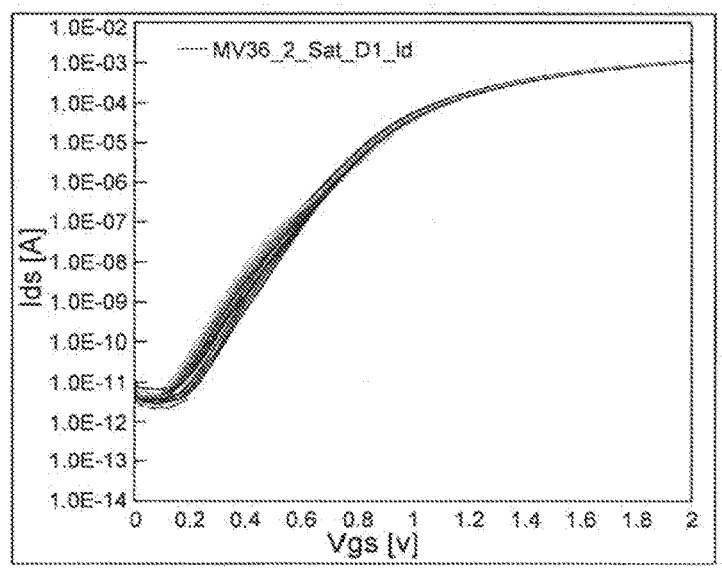
FIG. 6 is a characteristic diagram illustrating Vgs-Ids characteristics with respect to a plurality of samples of a MOS transistor having an element structure of FIG. 1 and a relatively small dimension Ds1 of a separation portion.
Figure 7:
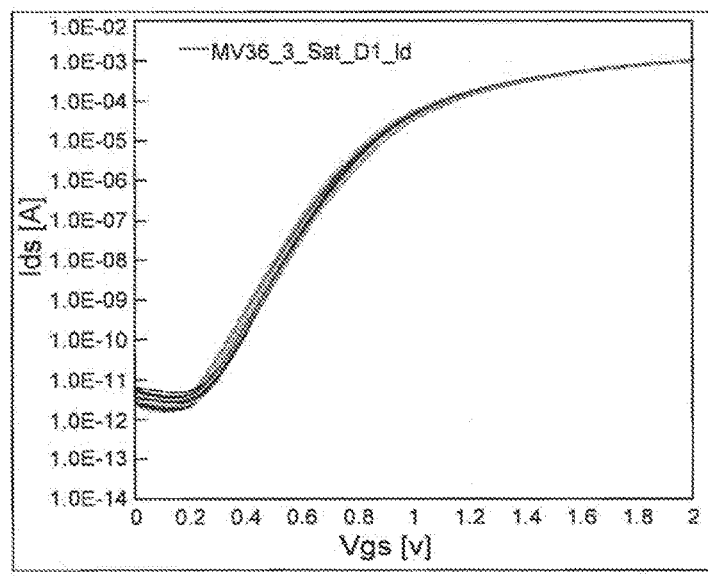
FIG. 7 is a characteristic diagram illustrating Vgs-Ids characteristics with respect to a plurality of samples of a MOS transistor having an element structure of FIG. 1 and a relatively large dimension Ds1 of a separation portion.
Figure 8:
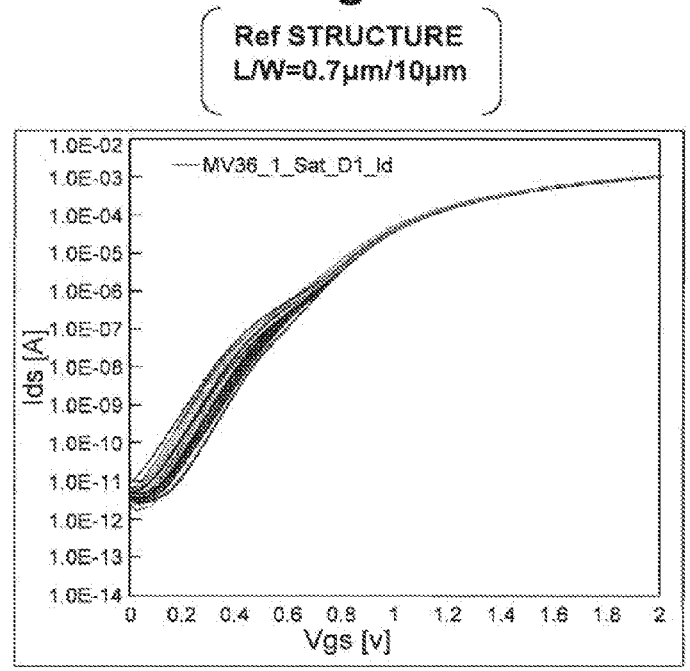
FIG. 8 is a characteristic diagram illustrating Vgs-Ids characteristics with respect to a plurality of samples of a MOS transistor having a device structure of FIG. 9.
Figure 9:
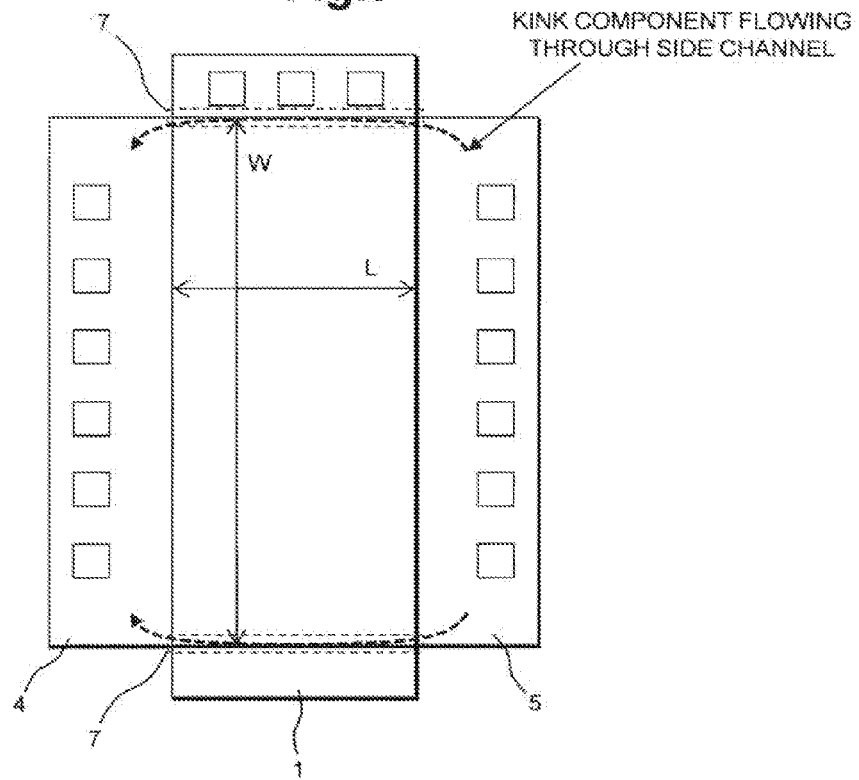
FIG. 9 is a plan view of a MOS transistor according to a comparative example in which a boundary portion is included which has both ends thereof come into contact with a source and drain region, and of which a length in the direction of a gate length becomes equal to the gate length.
Figure 10:
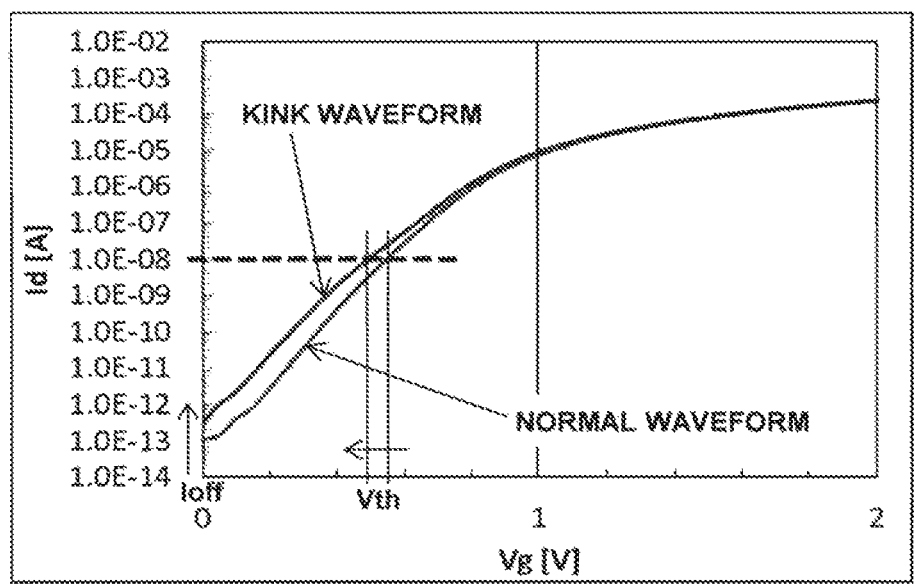
FIG. 10 is a waveform diagram illustrating together a normal Vgs-Ids waveform and a waveform when a kink current is generated with respect to this normal waveform.

FIGS. 6 and 7 illustrate the Vgs-Ids characteristics of a plurality of samples of the MOS transistor Q1a shown in FIG. 1. Herein, the gate length of the MOS transistor is set to 0.7 μm, and the gate width thereof is set to 10 μm. FIG. 8 illustrates the Vgs-Ids characteristics of a plurality of samples of the MOS transistor having a device structure of FIG. 9. The MOS transistor of FIG. 9 is configured such that both ends of the boundary portion 7 come into contact with the source and drain regions 4 and 5, a length in the direction of a gate length L becomes equal to the gate length L, a kink current is generated along the boundary portion 7, and that the degree of the kink current also varies between the samples. A waveform when the kink current is generated in a normal Vgs-Ids waveform becomes relatively large at a threshold voltage (Vth) or lower as illustrated in FIG. 10. It can be understood that the MOS transistor having the device structure of FIG. 9 generates the kink current as illustrated FIG. 8, and that the degree of the kink current also varies between the samples. FIG. 6 corresponds to a case where the distance Ds1 is set to 0.2 µm, and the effect of improving the kink phenomenon is seen, but the kink current remains slightly. FIG. 7 is a drawing for a sample in which the distance Ds1 is expanded to 0.4 µm, and it can be understood that the kink phenomenon disappears completely. From these results, it can be understood that the distance Ds1 is sufficient when the distance is approximately 0.4 µm as an example. On the other hand, the protrusion distance Ds2 shown in FIG. 1 may be set in consideration of a manufacturing variation so that a case does not occur in which the gate electrode pattern 1 deviates from the separation region 3, or oblique implantation into the source and drain influences a neighboring active region due to the penetration of a gate electrode sidewall, and may be set to approximately 0.2 µm as an example. The above-mentioned values cited as the dimensions of Ds1 and Ds2 and the dimensions of the gate length and the gate width are values of a medium-voltage MOS transistor having a gate withstand voltage of approximately 5 V to 8 V which is used as an example, and the dimensions of Ds1 and Ds2 may be appropriately determined in accordance with the withstand voltage of the MOS transistor, an element size or the like without being limited thereto.

Figure 11:
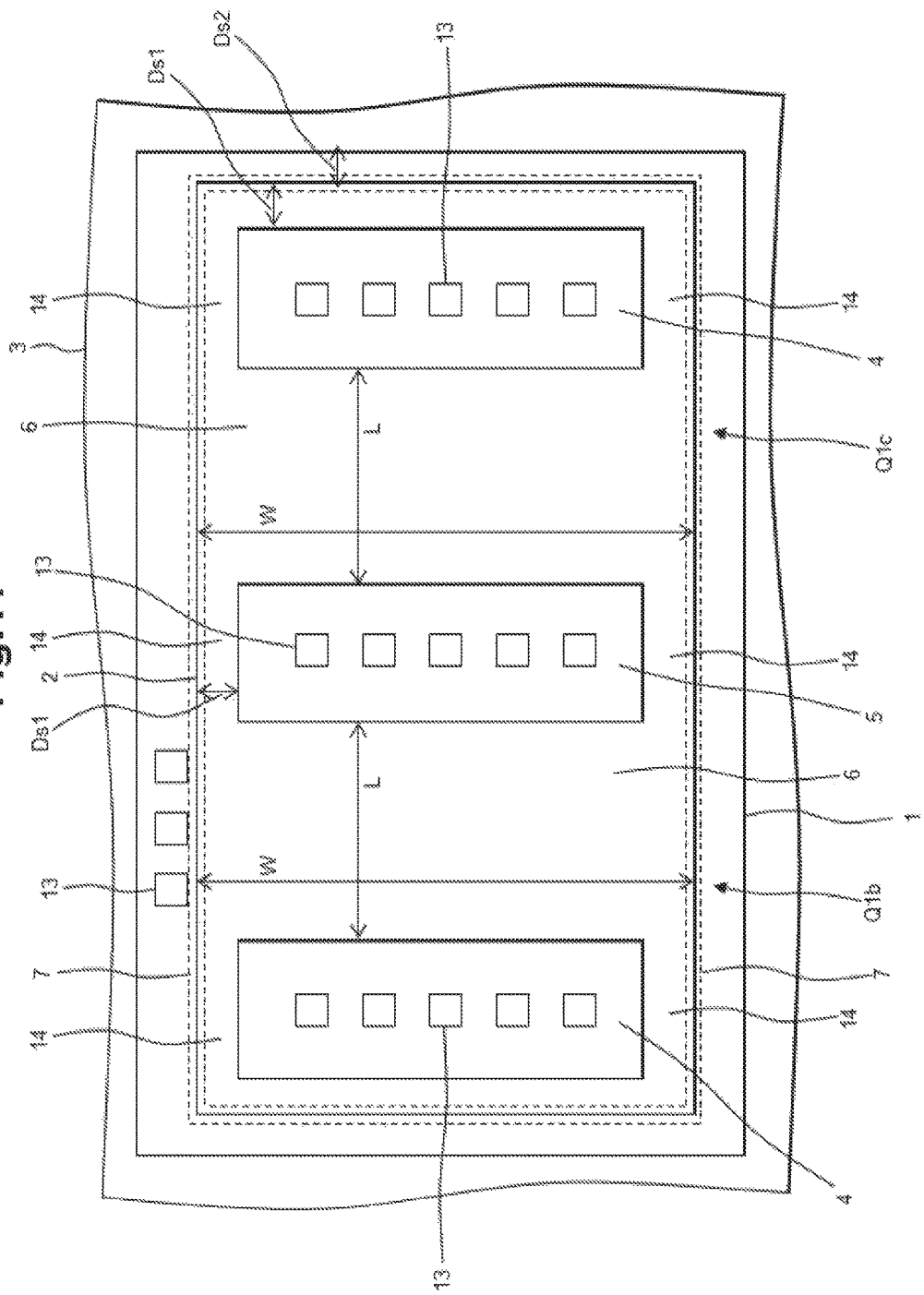
FIG. 11 is a plan view illustrating a second example of a planar layout configuration of a field effect transistor included in the semiconductor device according to the invention.

FIG. 11 shows a second example of a planar layout configuration of a field effect transistor included in the semiconductor device according to the invention. FIG. 11 is different from FIG. 1, in that the number of MOS transistors surrounded by the boundary portion 7 is set to two. That is, two MOS transistors Q1b and Q1c are formed in the active region 2, the boundary portion 7 surrounds these two MOS transistors Q1b and Q1c, and a portion of each of the surrounded source and drain regions 5 is made to be common between the MOS transistors Q1b and Q1c adjacent to each other. Since other components are the same as those of the MOS transistor described in FIG. 1, components having the same functions are denoted by the reference numerals and signs, and thus the description thereof will not be given. The number of MOS transistors surrounded by the boundary portion 7 is not limited to two, and an appropriately number may be adopted.

According to the structure of FIG. 11, it is possible to contribute to a reduction in the chip occupied area of two field effect transistors in which a gate is used in common and either of a source or a drain is used in common. The structure can be applied to a current mirror load or the like in which the gate of the two MOS transistors is connected in common, and the source thereof is connected in common. The gate in this case is the gate electrode pattern 1, and the drain is the source and drain electrode 4. Besides, it goes without saying that the same operational effect as that in FIG. 1 is exhibited.

Figure 12:
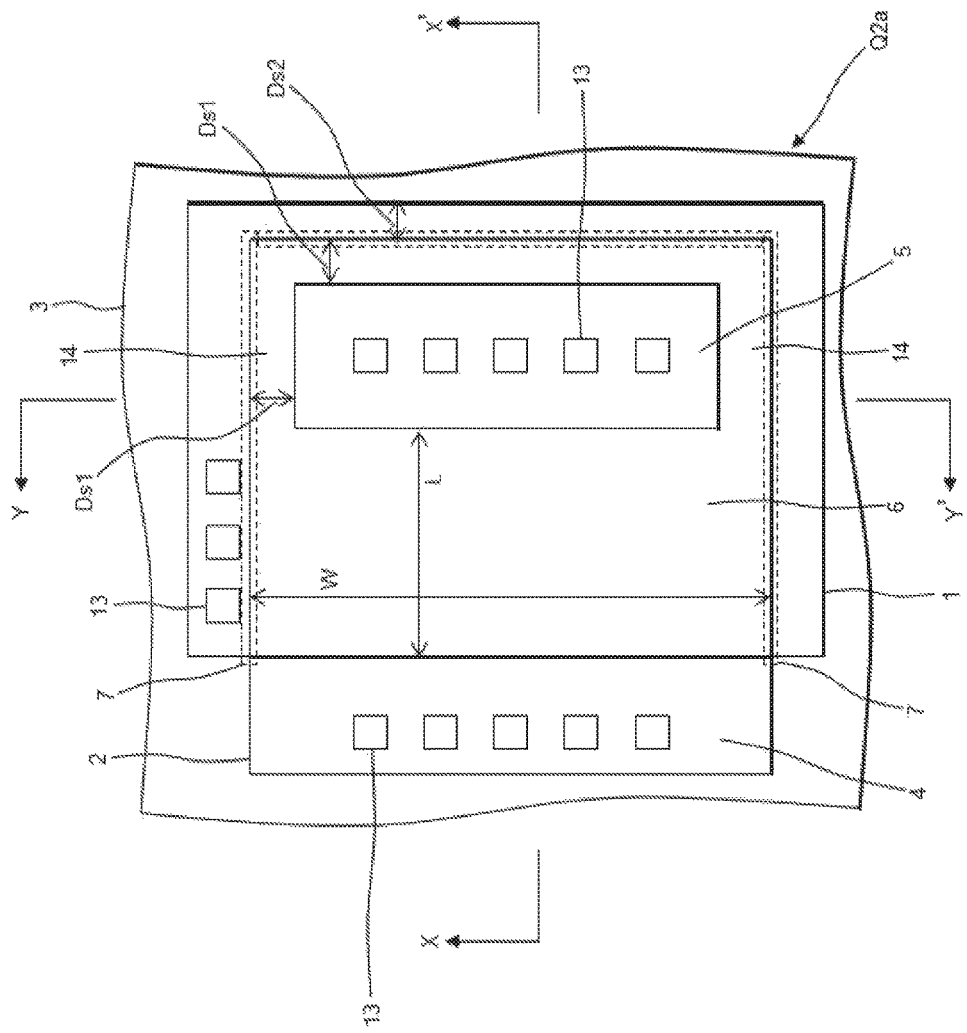
FIG. 12 is a plan view illustrating a third example of a planar layout configuration of a field effect transistor included in the semiconductor device according to the invention.
Figure 13:
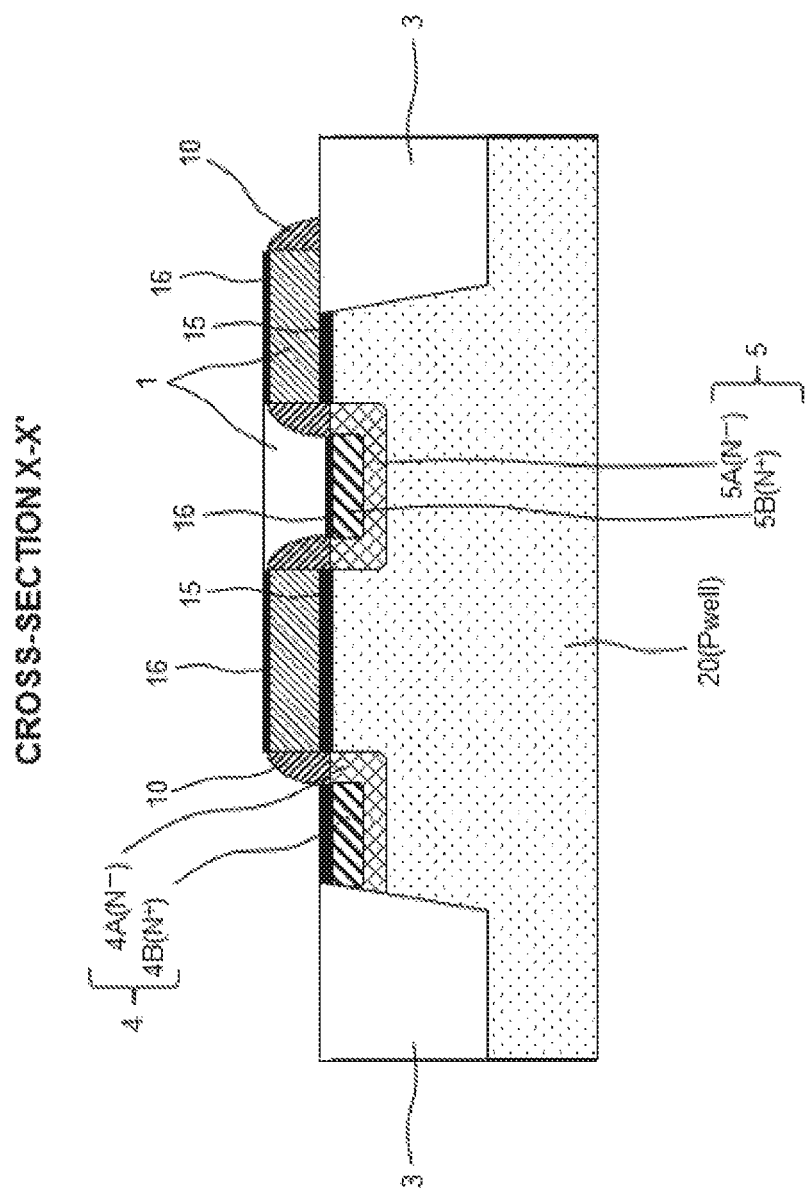
FIG. 13 is a cross-sectional view taken along line X-X' of FIG. 12.
Figure 14:
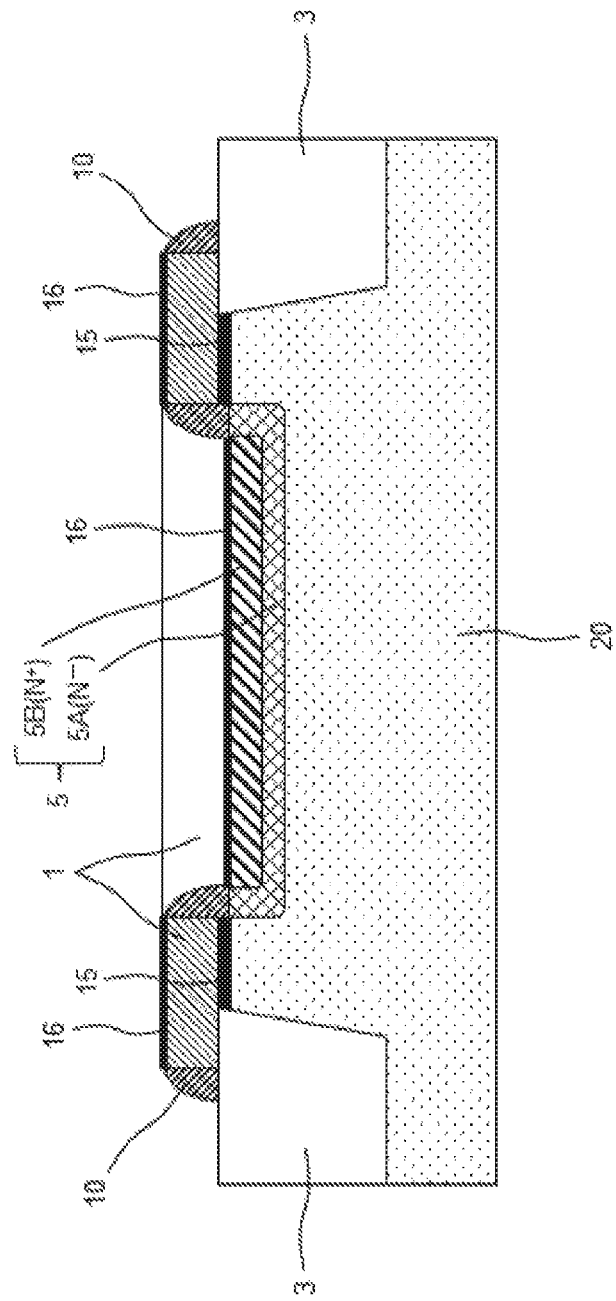
FIG. 14 is a cross-sectional view taken along line Y-Y' of FIG. 12.

Boundary Portion does not Come into Contact with One-Side Source and Drain Region FIG. 12 shows a third example of a planar layout configuration of a field effect transistor included in the semiconductor device according to the invention. FIG. 13 shows a cross-section X-X' of FIG. 12, and FIG. 14 shows across-section Y-Y' of FIG. 12.

FIG. 12 is different from FIG. 1, in that one of the source and drain regions of the MOS transistor is brought into contact with the boundary portion, and that the other thereof is separated from the boundary portion. That is, the boundary portion 7 comes into contact with one source and drain region 4 of the MOS transistor Q2a formed in the active region 2, and surrounds the other source and drain region 5 and the channel region 6 from three directions when seen in a plan view. The other source and drain region 5 is not brought into contact with the boundary portion 7. Therefore, the vicinity of one source and drain region 4 that comes into contact with the boundary portion 7 is not required to be covered with the gate electrode pattern 1. Since other components are the same as those of the MOS transistor described in FIG. 1, components having the same functions are denoted by the reference numerals and signs, and thus the description thereof will not be given.

According to this, since the boundary portion 7 does not come into contact with the other source and drain region 5 of the field effect transistor, the boundary portion 7 does not constitute a side channel for causing a current to flow from one source and drain region to the other source and drain region. The generation of the kink current can be suppressed or alleviated, and the same operational effect as that of the element structure shown in FIG. 1 is exhibited. Further, the chip occupied area of the active region 2 and the gate electrode pattern 1 can be reduced on the one source and drain region 4 side that comes into contact with the boundary portion 7, as compared to the MOS transistor Q1a of FIG. 1. In addition, it is advantageous in the aspect of characteristics that the source and drain electrode 5 having a boundary with the separation region 3 covered with the gate electrode pattern 1 is used as a source electrode rather than used in a drain electrode. That is, the corner portion of the source and drain electrode causes electric field concentration to occur between the gate electrode pattern and the corner portion, and a depletion layer is formed in a pn junction portion between the active region 2 and the source and drain region in accordance with the voltage of the source and drain region. Therefore, considering that in an off-state, a gate-to-drain voltage becomes higher than a gate-to-source voltage, it is preferable that the source and drain electrode 5 covered with the gate electrode pattern 1 is used as a source electrode, in that a withstand voltage is obtained by making the distance Ds1 of the separation portion 14 extremely small. Meanwhile, when a required withstand voltage is guaranteed by securing the distance Ds1 only as needed, it is allowed to use the source and drain region 5 as a drain.

Figure 15:
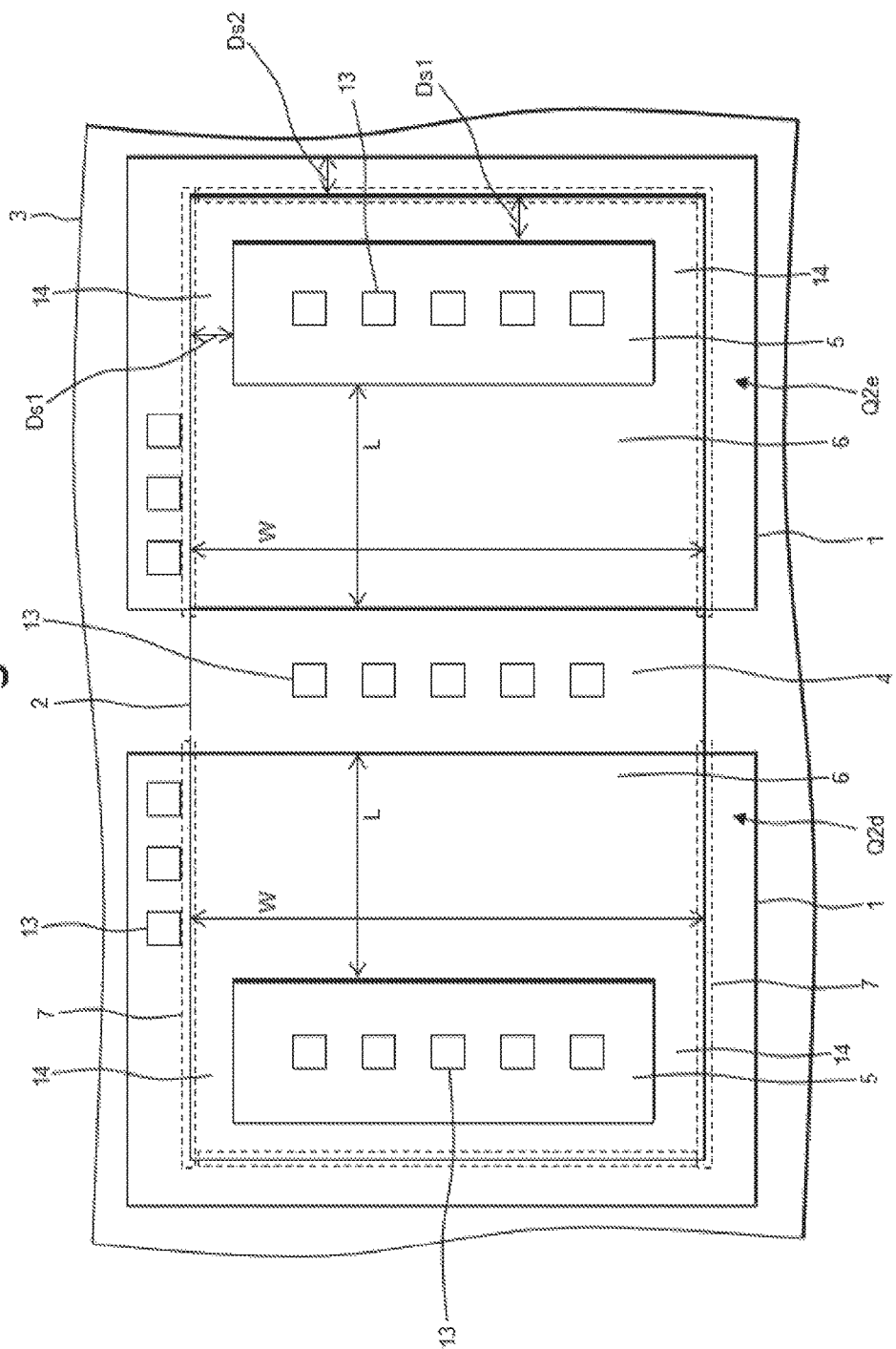
FIG. 15 is a plan view illustrating a fourth example of a planar layout configuration of a field effect transistor included in the semiconductor device according to the invention.

FIG. 15 shows a fourth example of a planar layout configuration of a field effect transistor included in the semiconductor device according to the invention. In FIG. 15, MOS transistors Q2d and Q2e are constituted by individualizing the source and drain regions 5 interposed in the boundary portion 7 in the direction of the gate width W mainly based on the planar configuration of the MOS transistor Q2a shown in FIG. 12, and using the other source and drain region 4 in common. Other components are the same as those in FIG. 12, components having the same functions are denoted by the reference numerals and signs, and thus the description thereof will not be given.

According to this, it is possible to contribute to a reduction in the chip occupied area of two field effect transistors in which either of a source or a drain is used in common. The source and drain region 4 which is used in common preferably serves as a drain electrode as described above, but can be applied to a differential input circuit or the like in which, for example, the source of two field effect transistors is connected in common and the drain and gate thereof are individualized, without being limited thereto. Besides, it goes without saying that the operational effects described in FIGS. 1 and 12 are exhibited.

Figure 16:
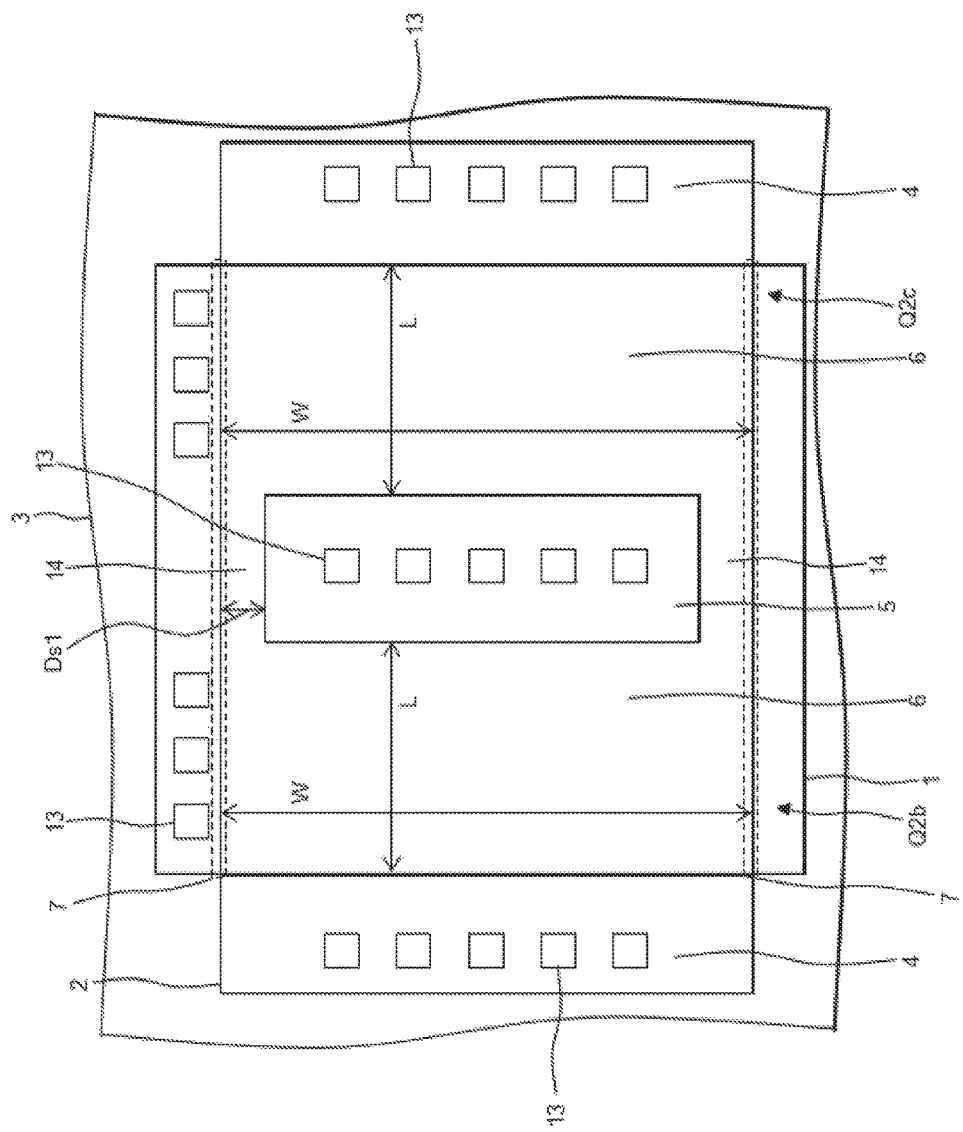
FIG. 16 is a plan view illustrating a fifth example of a planar layout configuration of a field effect transistor included in the semiconductor device according to the invention.

FIG. 16 shows a fifth example of a planar layout configuration of a field effect transistor included in the semiconductor device according to the invention. In FIG. 16, the gate electrode pattern 1 striding over the boundary portion 7 is shared by two field effect transistors Q2*b* and Q2*c* adjacent to each other, and the two field effect transistors Q2*b* and Q2*c* share one source and drain region 5. Therefore, the boundary portion 7 has the shared source and drain region 5 and each channel region 6 interposed therein in the direction of the gate width, and does not have a layout in which the channel region 6 is surrounded from three directions as shown in FIG. 12. Besides, since the drawing is the same as FIG. 12, components having the same functions are denoted by the reference numerals and signs, and thus the description thereof will not be given.

According to this, it is possible to contribute to a reduction in the chip occupied area of two field effect transistors in which a gate is used in common and either of a source or a drain is used in common. For example, it is possible to make an application to a current mirror load or the like in which the gate of two field effect transistors is connected in common, and the source thereof is connected in common. Particularly, the chip occupied areas of the active region 2 and the gate electrode pattern 1 can be reduced on one source and drain region 4 side that comes into contact with the boundary portion 7 as compared to the MOS transistors Q1*b* and Q1*c* of FIG. 11.

Figure 17:
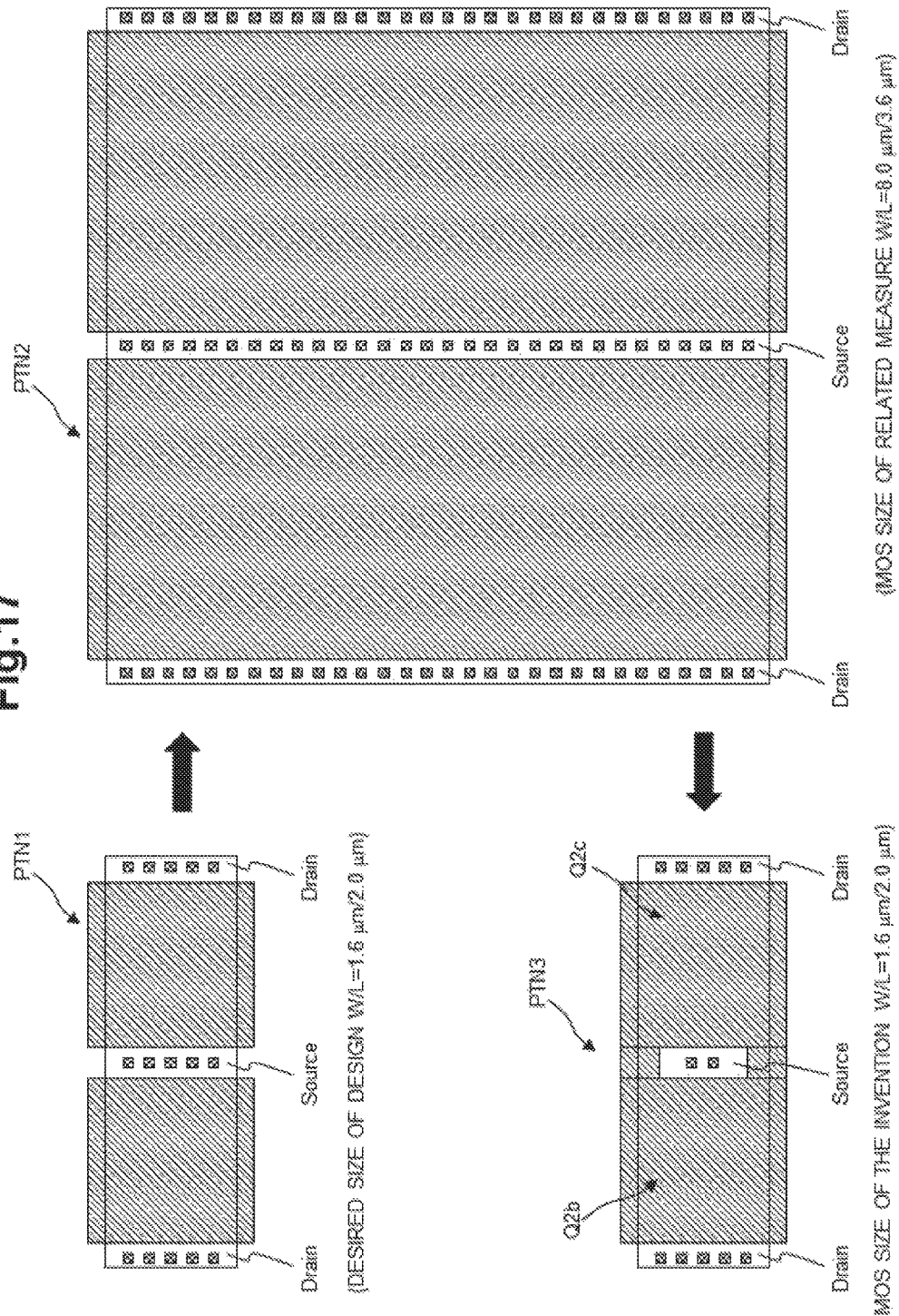
FIG. 17 is a diagram specifically illustrating an effect of reducing a chip occupied area through the layout configuration of FIG. 16.

Such an effect of reducing the chip occupied area is compared with that in a case where a MOS transistor structure illustrated in FIG. 9, that is, a structure in which the boundary portion 7 becomes equal to the gate length and comes into contact with both the source and drain regions 4 and 5 is adopted. For example, as illustrated in FIG. 17, in case that a layout is configured by sharing one source and drain region serving as a source, and the right and left MOS transistors are treated as separate MOS transistors, a case is considered in which the transistors are uses as a pair of MOS transistors by connecting a gate electrode as in a current mirror circuit. A first layout pattern PTN1 indicates a pair of MOS transistors having a size of W/L=1.6 μm/2.0 μm as a desired MOS transistor size (desired size of design) from circuit characteristics and a layout area. In case that the structure in the related art of the MOS transistor is not changed with respect to this desired size of design, that is, the invention is not applied thereto, the MOS transistor size is set to W/L=8 μm/3.6 μm as shown in a layout pattern PTN2 in order to prevent a kink current from being generated, and an area seven times the desired size of design is required. This is because a circuit configuration is formed in which pair accuracy is required in a high current region having no influence of kink by increasing a gate length to reduce the degree of kink and increasing a W size to increase an operating current. Thereby, the adverse effect of power consumption being increased is caused. A layout pattern PTN3 is a pattern obtained by adopting the example of FIG. 16, and can be laid out without increasing an area with respect to the original desired size of design while suppressing a kink phenomenon. This makes it possible to reduce the chip occupied area to a seventh layout of that of the pattern PTN2.

Figure 18:
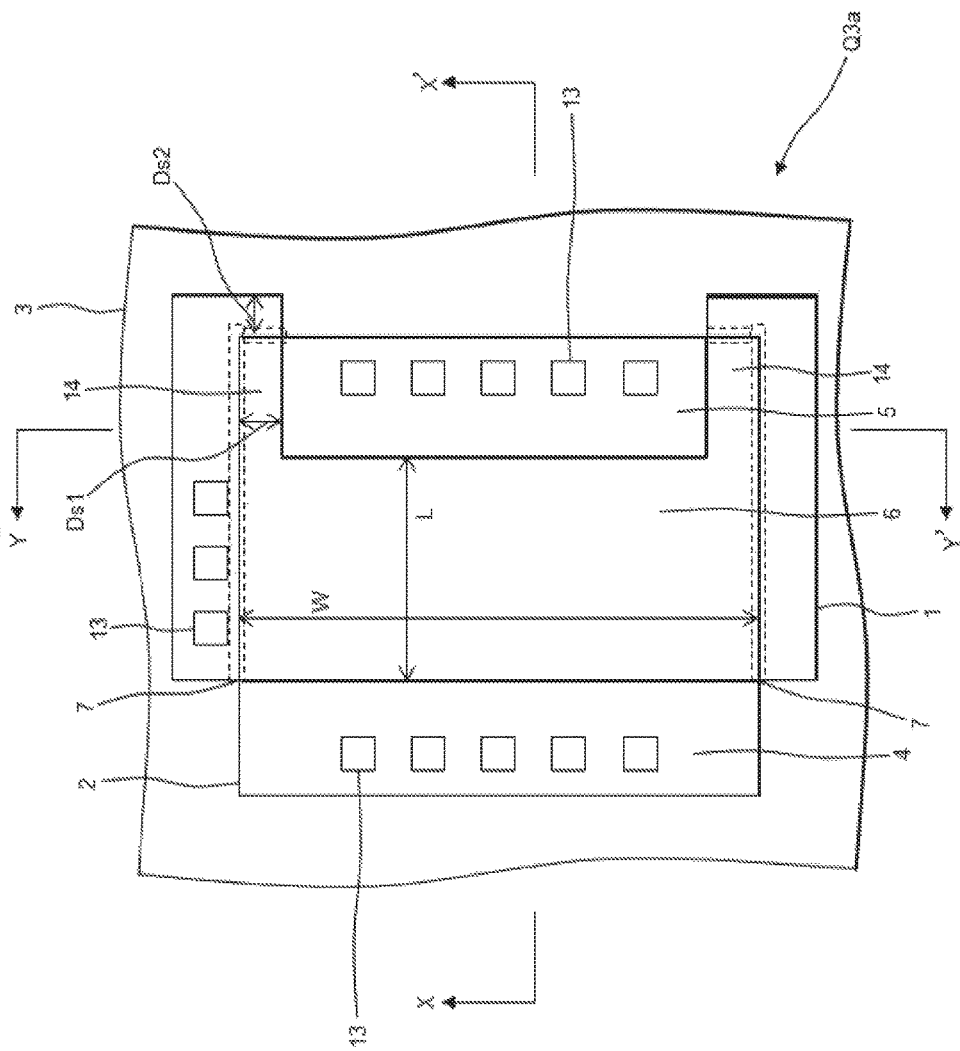
FIG. 18 is a plan view illustrating a sixth example of a planar layout configuration of a field effect transistor included in the semiconductor device according to the invention.
Figure 19:
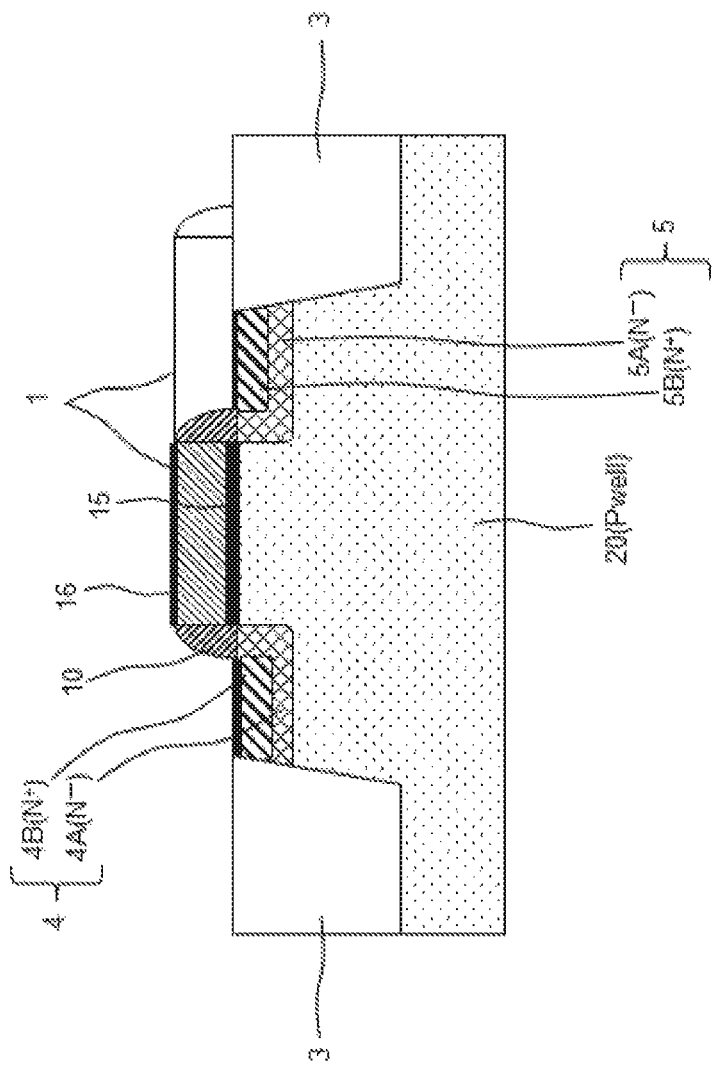
FIG. 19 is a cross-sectional view taken along line X-X' of FIG. 18.

Boundary Portion Larger than Gate Length Comes into Contact with Both Source and Drain Regions FIG. 18 shows a sixth example of a planar layout configuration of a field effect transistor included in the semiconductor device according to the invention. FIG. 19 shows a cross-section X-X' of FIG. 18, and FIG. 20 shows a cross-section Y-Y' of FIG. 18.

Figure 20:
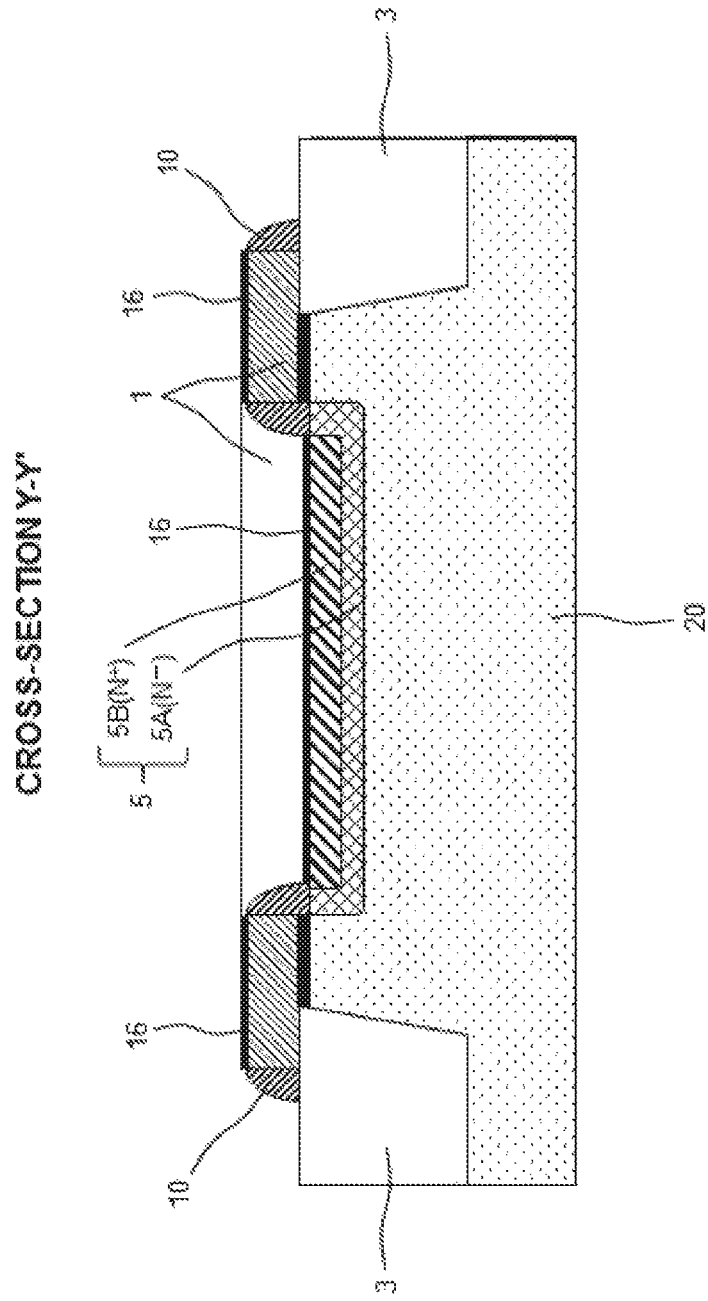
FIG. 20 is a cross-sectional view taken along line Y-Y' of FIG. 18.

The MOS transistor shown in FIGS. 18 to 20 is different from those shown in FIGS. 1 and 12, in that the boundary portion 7 comes into contact with both the source and drain regions 4 and 5. That is, the boundary portion 7 over which the gate electrode pattern 1 strides comes into contact with both a pair of source and drain regions 4 and 5 of the field effect transistor Q3*a* formed in the active region 2, one source and drain region 5 has the separation portion 14 formed between the boundary portion 7 and the region, and the length of the boundary portion 7 from a position at which the boundary portion 7 and the one source and drain region 5 come into contact with each other to a position at which the boundary portion 7 comes into contact with the other source and drain region 4 through the separation portion 14 becomes larger than the gate length L of the field effect transistor Q3*a*. The length of one source and drain region 5 in the direction of the gate width becomes smaller than the length of the other source and drain region 4 in the direction of the gate width, and the boundary portion 7 covered with a gate electrode pattern has one source and drain region 5 and the channel region 6 of the field effect transistor Q3*a*, formed in the active region 2, interposed therein in the direction of the gate width. From the same reason as that described in the example of FIG. 12, it is preferable that the source and drain electrode 5 covered with the gate electrode pattern 1 serves as a source electrode. Since other components are the same as those shown in FIGS. 1 and 12, components having the same functions are denoted by the reference numerals and signs, and thus the description thereof will not be given.

The boundary portion 7 which is a cause of kink comes into contact with both the source and drain electrodes 4 and 5, and thus a source-to-drain current flows through the boundary portion 7. However, the length of the boundary portion 7 that connects a source and a drain is larger than the gate length L, and the degree of generation of a kink current is reduced as the length becomes larger. The effect of improving a kink phenomenon becomes smaller than that in the example of FIG. 1 or 12, but there is an advantage that a layout can be formed without increasing the size of the active region 2 as compared to the structure in the related art as shown in FIG. 9. That is, since the active region may not be formed exceeding the source and drain regions 4 and 5 in the direction of the gate length, and the gate electrode pattern is not also required to be expanded, the chip areas thereof can be made smaller than that of the MOS transistor Q2*a* of FIG. 12.

Figure 21:
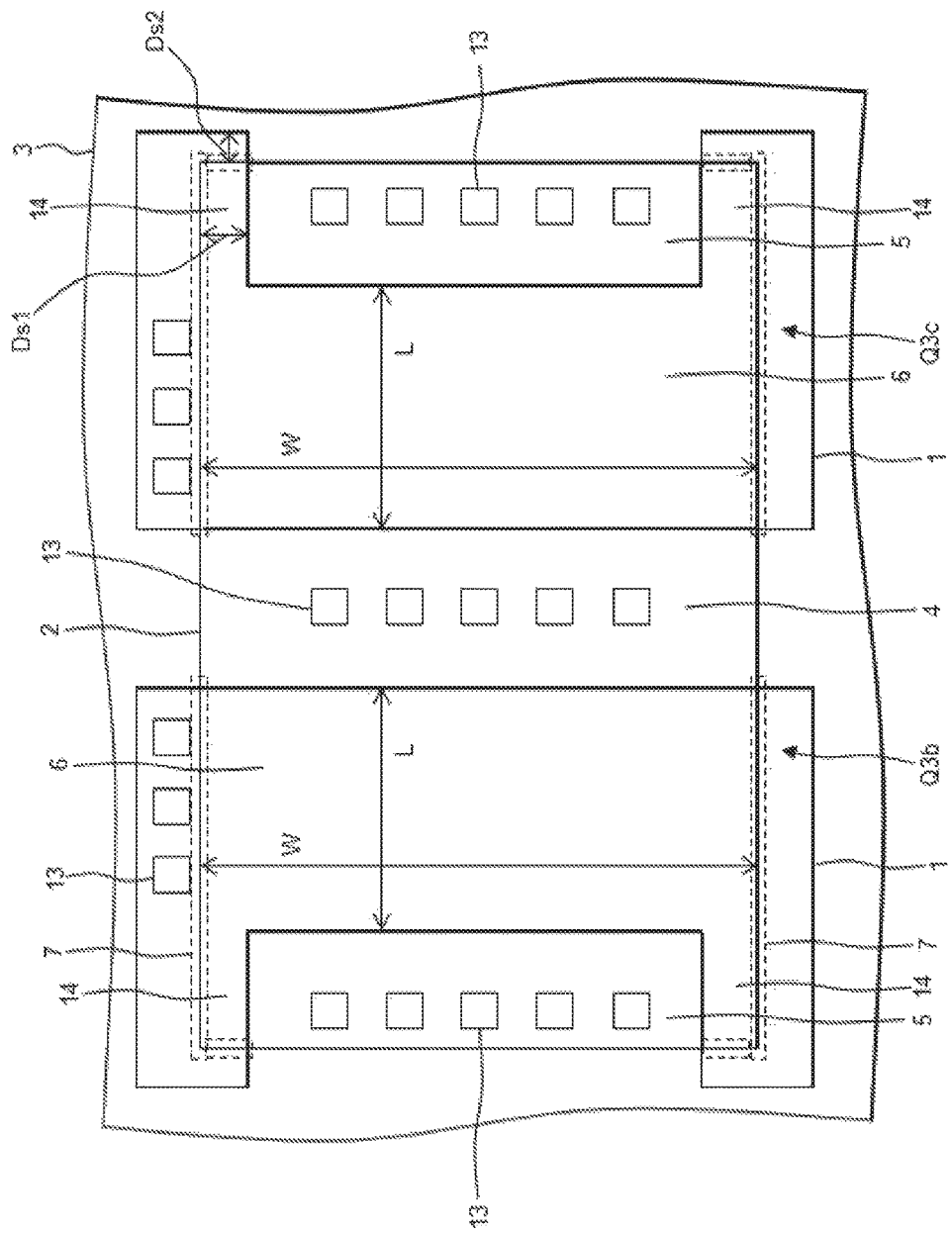
FIG. 21 is a plan view illustrating a seventh example of a planar layout configuration of a field effect transistor included in the semiconductor device according to the invention.

FIG. 21 shows a seventh example of a planar layout configuration of a field effect transistor included in the semiconductor device according to the invention. FIG. 21 shows two MOS transistors Q3*b* and Q3*c* in which, mainly based on the planar configuration of the MOS transistor Q3*a* of FIG. 18, one source and drain region 4 having large dimensions in the direction of the gate width is used in common, and the other source and drain region 5 is individualized. Since other components are the same as those in FIG. 18, components having the same functions are denoted by the reference numerals and signs, and thus the description thereof will not be given.

According to this, it is possible to contribute to a reduction in the chip occupied area of two field effect transistors in which either of a source or a drain is used in common. The source and drain region 4 which is used in common preferably serves as a drain electrode as described above, but may be applied to a differential input circuit or the like in which, for example, the source of two field effect transistors is connected in common and the drain and the gate are individualized, without being limited thereto.

Figure 22:
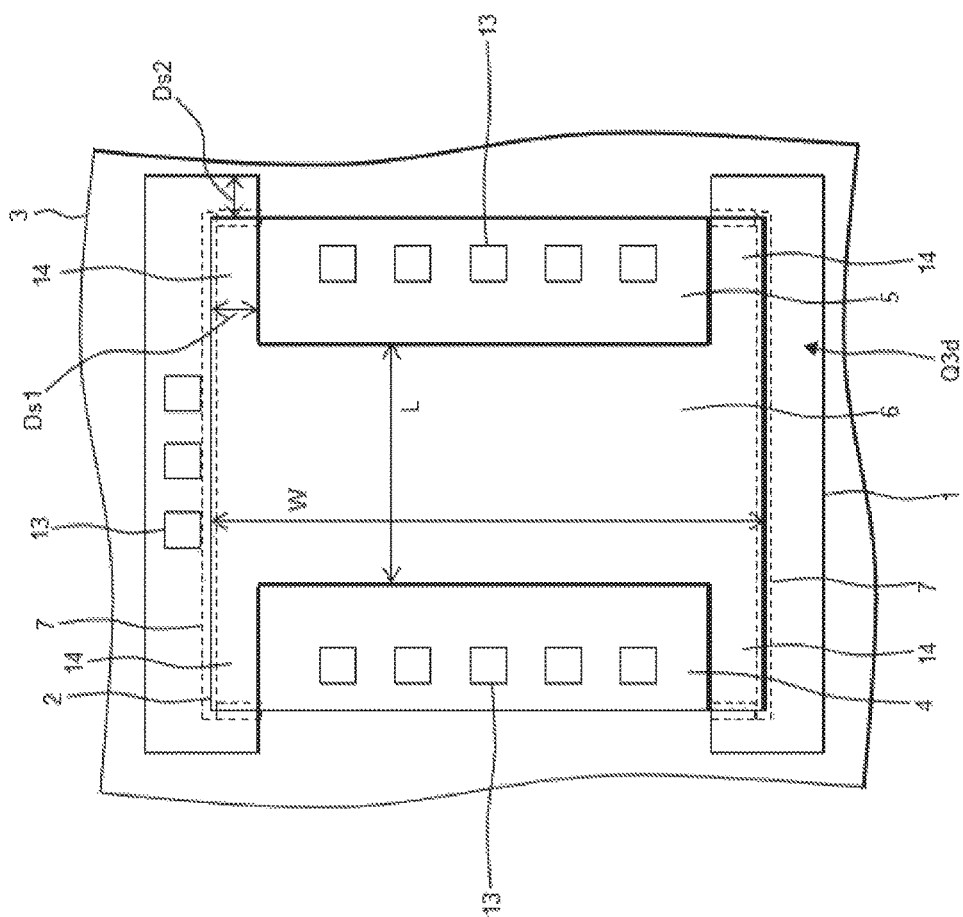
FIG. 22 is a plan view illustrating an eighth example of a planar layout configuration of a field effect transistor included in the semiconductor device according to the invention.

FIG. 22 shows an eighth example of a planar layout configuration of a field effect transistor included in the semiconductor device according to the invention. The MOS transistor Q3d shown in FIG. 22 is different from the MOS transistor Q3a shown in FIG. 18, in that a layout so that each of the source and drain regions 4 and 5 includes the separation portion 14 between the boundary portion 7 and the regions, and that the boundary portion 7 has both the source and drain regions 4 and 5 and the channel region 6 interposed therein in the direction of the gate width. Since other components are the same as those in FIG. 18, components having the same functions are denoted by the reference numerals and signs, and thus the description thereof will not be given.

According to this, since the length of non-contact of the boundary portion 7 with the source and drain regions 4 and 5 becomes larger than that of the MOS transistor Q3a of FIG. 18, the degree of a current undesirably flowing through aside channel of the boundary portion 7 can be further alleviated to that extent, and thus the effect of improving a kink phenomenon is improved.

Method of Manufacturing Semiconductor Device

Next, a method of manufacturing the aforementioned MOS transistor will be simply described. A method of forming a separation portion and then forming a gate oxide film is shown in FIGS. 23 to 37, and a method in which thinning is not caused to occur by forming a gate oxide film and then forming a separation portion is shown in FIGS. 38 to 53. The cross-section structure of the MOS transistor shown herein is set to the cross-section structure of the related art for the purpose of simplifying the illustration, but in reality, the manufacturing method does not change even in case that the above cross-section structure is replaced by the cross-section structures of the MOS transistors described in FIGS. 1 to 22. Although not particularly limited, herein, illustrations are given of methods of manufacturing a low-voltage n-channel type MOS transistor (low-voltage NMOS), a low-voltage p-channel type MOS transistor (low-voltage PMOS), a medium-voltage n-channel type MOS transistor (medium-voltage NMOS), and a medium-voltage p-channel type MOS transistor (medium-voltage PMOS). The operating voltages of the medium-voltage NMOS and the medium-voltage PMOS are, for example, 6 V, and the operating voltages of the low-voltage NMOS and the low-voltage PMOS are, for example, 1.5 V. The MOS transistor having an operating voltage of 1.5 V is configured such that the gate insulating film thereof is smaller in thickness than the gate insulating film of the MOS transistor having a voltage of 6.0V, and that the film thickness thereof is appropriately 1 to 3 nm.

Figure 23:
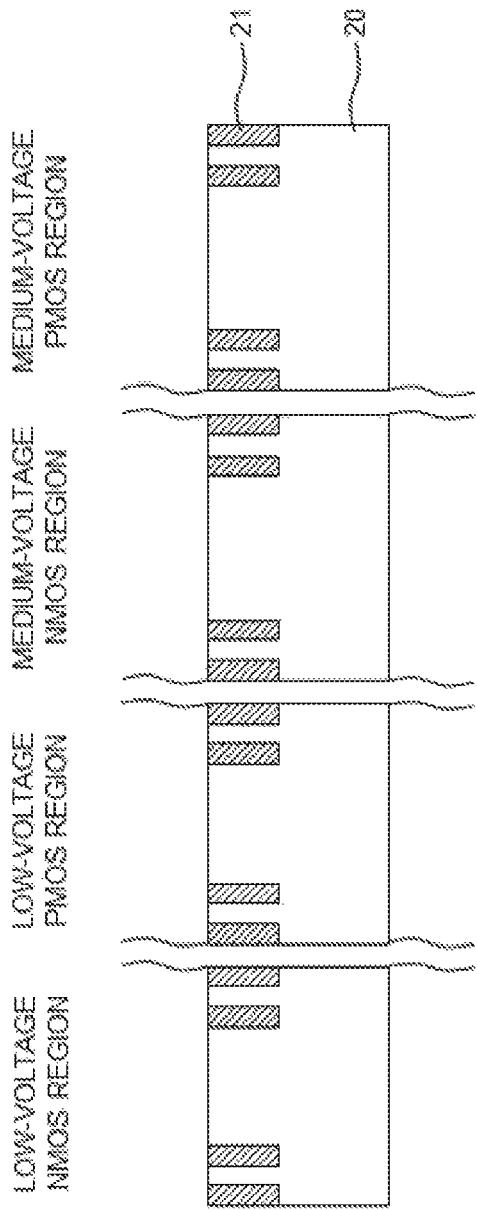
FIG. 23 is across-sectional view illustrating main parts of a semiconductor substrate of a medium-voltage MOS region and a low-voltage MOS region in a process of manufacturing a MOS transistor so as to form a gate oxide film after a separation portion is formed.

First, as shown in FIG. 23, a p-type semiconductor substrate 20 is prepared, and an STI 21 is formed therein as a separation region. An active region is formed in a region defined by STI 21.

Figure 24:
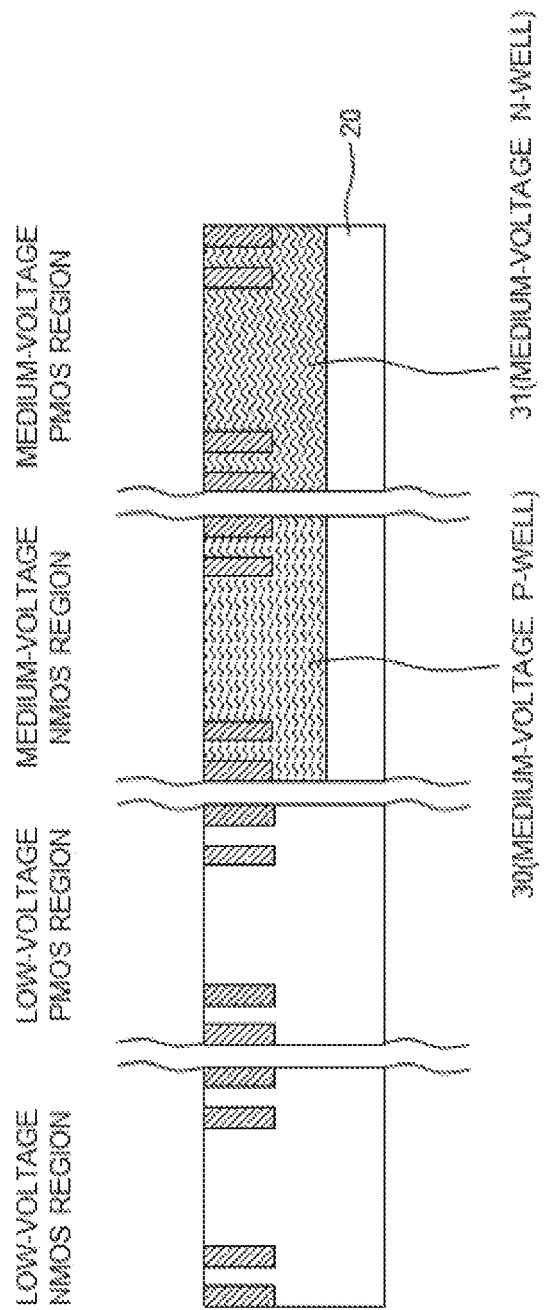
FIG. 24 is across-sectional view illustrating main parts of the semiconductor substrate of a medium-voltage MOS region and a low-voltage MOS region in a process of manufacturing a semiconductor device subsequently to FIG. 23.

As shown in FIG. 24, a medium-voltage p-type well (medium-voltage p-well) 30 for a medium-voltage NMOS and a medium-voltage n-type well (medium-voltage n-well) 31 for a medium-voltage PMOS are formed on a main surface of a p-type semiconductor substrate 20 by a photo-lithography (hereinafter, simply referred to as lithography) process, an ion implantation process, and the like. The lithography process is a series of processes of forming a desired resist pattern through the application, exposure, development and the like of a photoresist (hereinafter, simply referred to as resist) film. In the ion implantation process, a desired impurity is selectively introduced into a desired portion of the semiconductor substrate 20, using the resist pattern formed on the main surface of the semiconductor substrate 20 through the lithography process as a mask. The resist pattern herein is formed of a pattern in which an impurity introduction region is exposed and other regions are covered.

Figure 25:
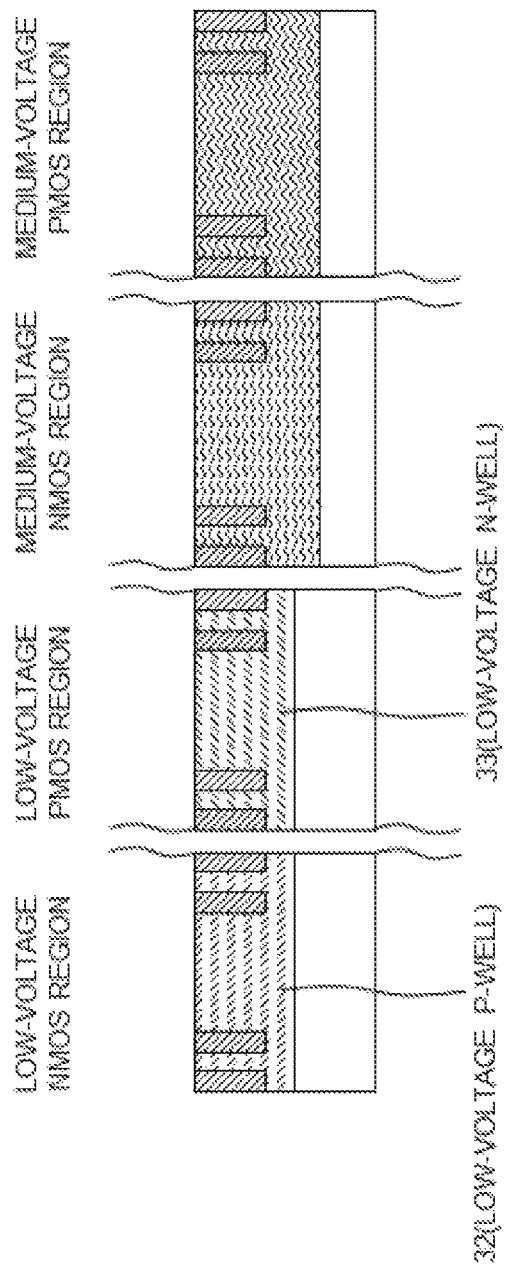
FIG. 25 is across-sectional view illustrating main parts of the semiconductor substrate of a medium-voltage MOS region and a low-voltage MOS region in a process of manufacturing a semiconductor device subsequently to FIG. 24.

Subsequently, as shown in FIG. 25, a low-voltage p-type well (low-voltage p-well) 32 for a low-voltage NMOS and a low-voltage n-type well (low-voltage n-well) 33 for a low-voltage PMOS are formed by the lithography process, the ion implantation process, and the like.

Figure 26:
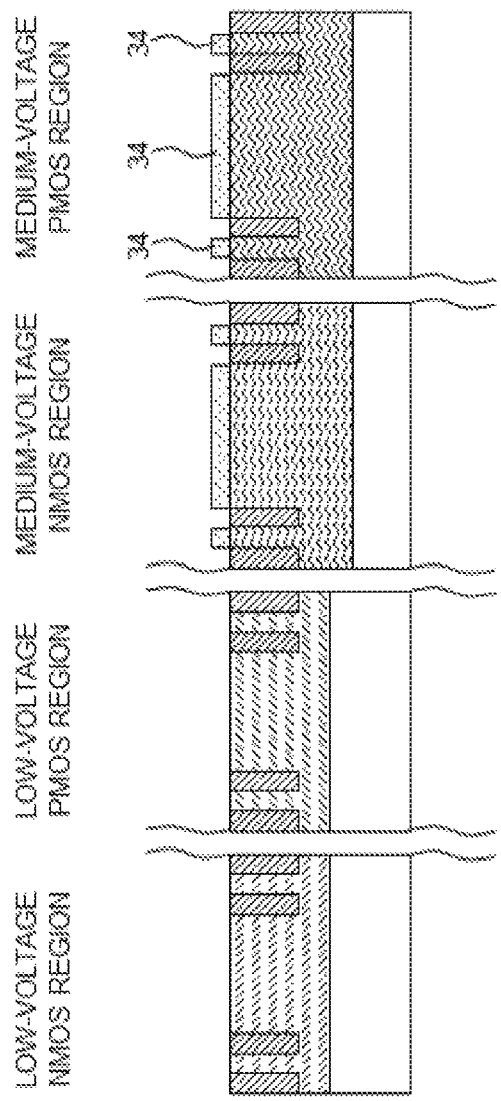
FIG. 26 is across-sectional view illustrating main parts of the semiconductor substrate of a medium-voltage MOS region and a low-voltage MOS region in a process of manufacturing a semiconductor device subsequently to FIG. 25.
Figure 27:
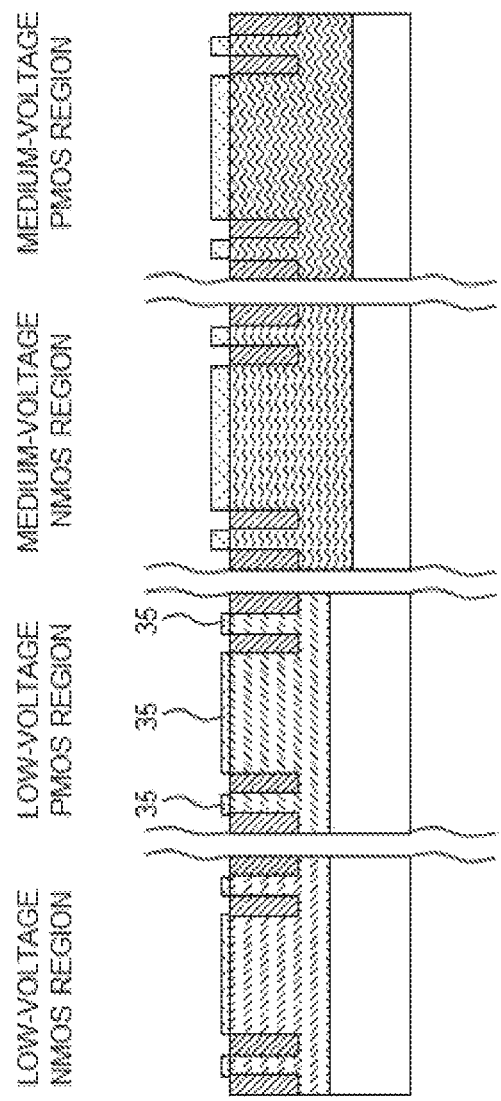
FIG. 27 is across-sectional view illustrating main parts of the semiconductor substrate of a medium-voltage MOS region and a low-voltage MOS region in a process of manufacturing a semiconductor device subsequently to FIG. 26.

Next, a gate oxide film (medium-voltage gate oxide film) 34 for a medium-voltage NMOS and a medium-voltage PMOS is formed only in a medium-voltage MOS region by lithography as shown in FIG. 26, and a gate oxide film (low-voltage gate oxide film) 35 for a low-voltage NMOS and a low-voltage PMOS is formed as shown in FIG. 27. The medium-voltage gate oxide film 34 is formed to be thicker than the low-voltage gate oxide film 35. The gate insulating film 34 has a thickness of 11.5 nm, and the gate insulating film 35 has a thickness of 2 nm. The gate insulating film can also be obtained by laminating an insulating film deposited by a CVD method or the like, in addition to the oxide film formed by the thermal oxidation method.

Figure 28:
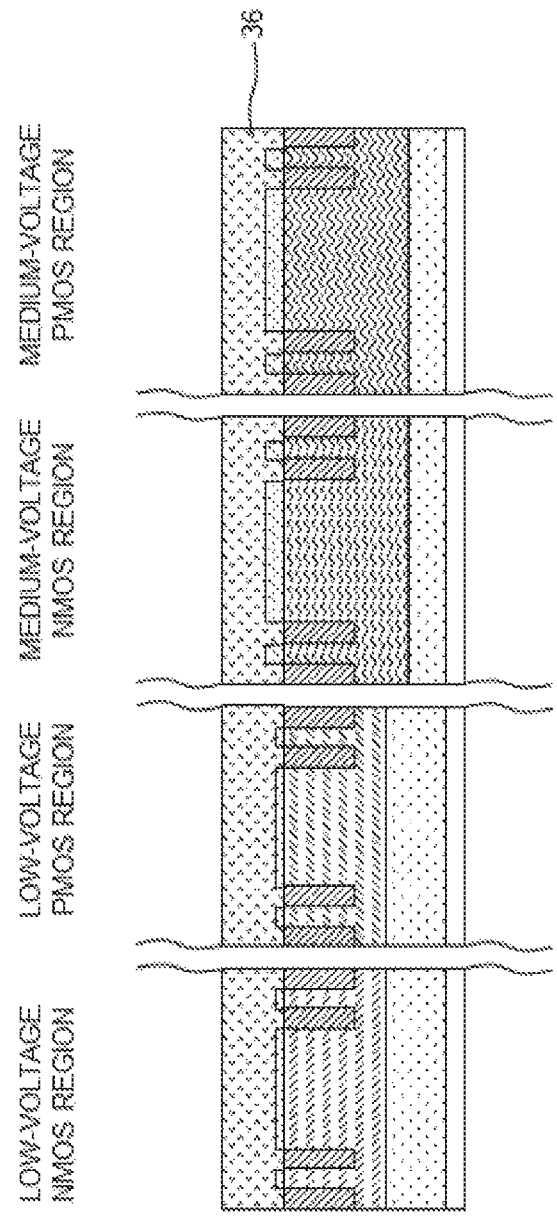
FIG. 28 is across-sectional view illustrating main parts of the semiconductor substrate of a medium-voltage MOS region and a low-voltage MOS region in a process of manufacturing a semiconductor device subsequently to FIG. 27.
Figure 29:
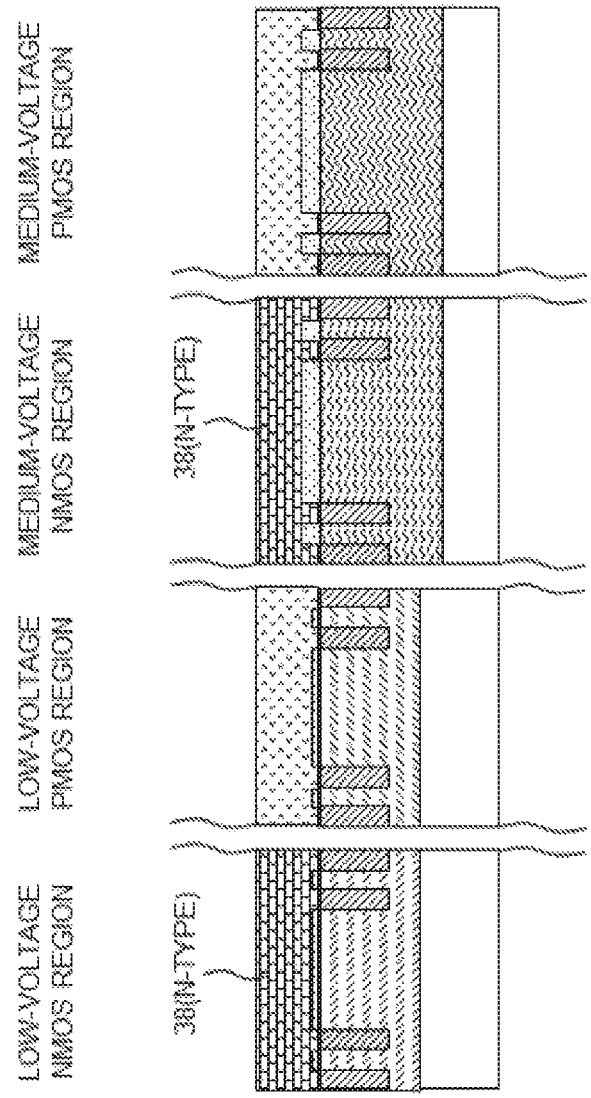
FIG. 29 is across-sectional view illustrating main parts of the semiconductor substrate of a medium-voltage MOS region and a low-voltage MOS region in a process of manufacturing a semiconductor device subsequently to FIG. 28.
Figure 30:
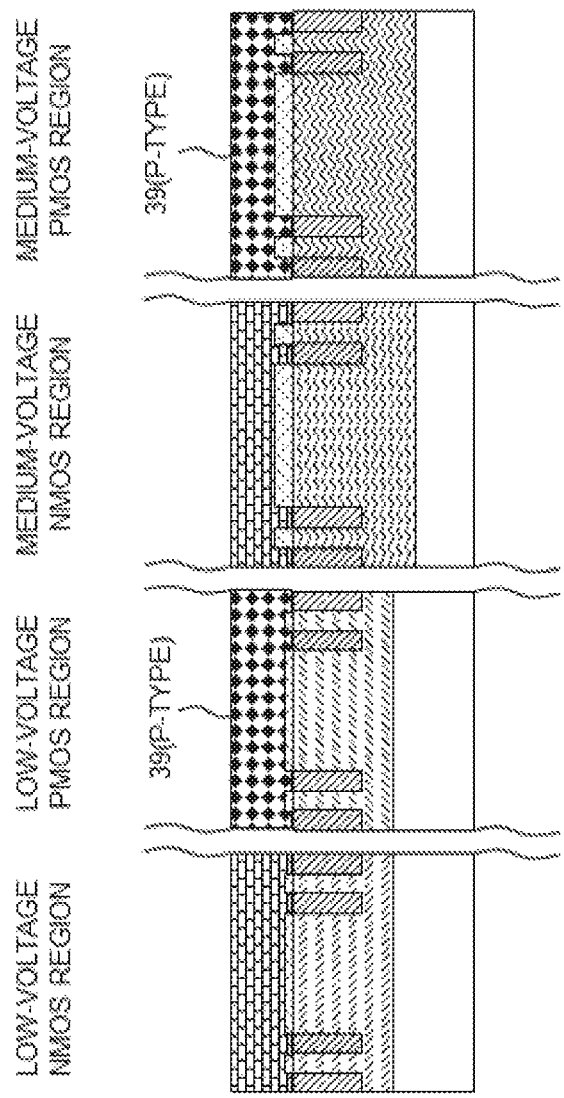
FIG. 30 is across-sectional view illustrating main parts of the semiconductor substrate of a medium-voltage MOS region and a low-voltage MOS region in a process of manufacturing a semiconductor device subsequently to FIG. 29.
Figure 31:
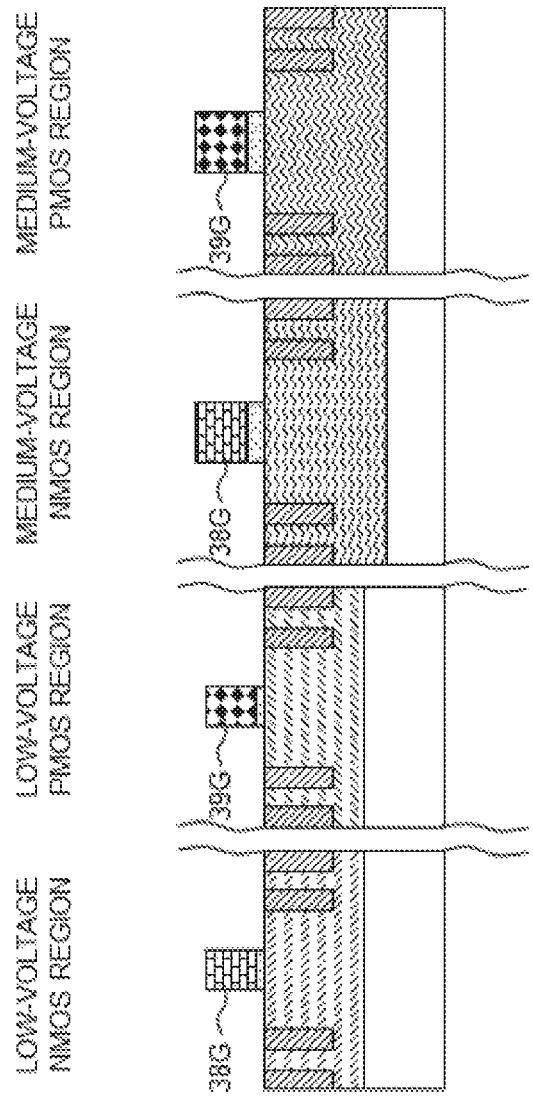
FIG. 31 is across-sectional view illustrating main parts of the semiconductor substrate of a medium-voltage MOS region and a low-voltage MOS region in a process of manufacturing a semiconductor device subsequently to FIG. 30.

After the gate insulating film is formed, a conductor film 36 formed of, for example, low-resistance polycrystalline silicon is formed on the main surface of the semiconductor substrate 20, as shown in FIG. 28, by the chemical vapor deposition (CVD) method or the like. A conductor film 38 is formed by implanting an n-type impurity into the conductor film 36 for a low-voltage NMOS and a medium-voltage NMOS (FIG. 29), and a conductor film 39 is formed by implanting a p-type impurity into the conductor film 36 for a low-voltage PMOS and a medium-voltage PMOS (FIG. 30). Gate electrode patterns 38G and 39G are formed by the lithography process by processing the conductor films 38 and 39 after the impurity implantation (FIG. 31).

Figure 32:
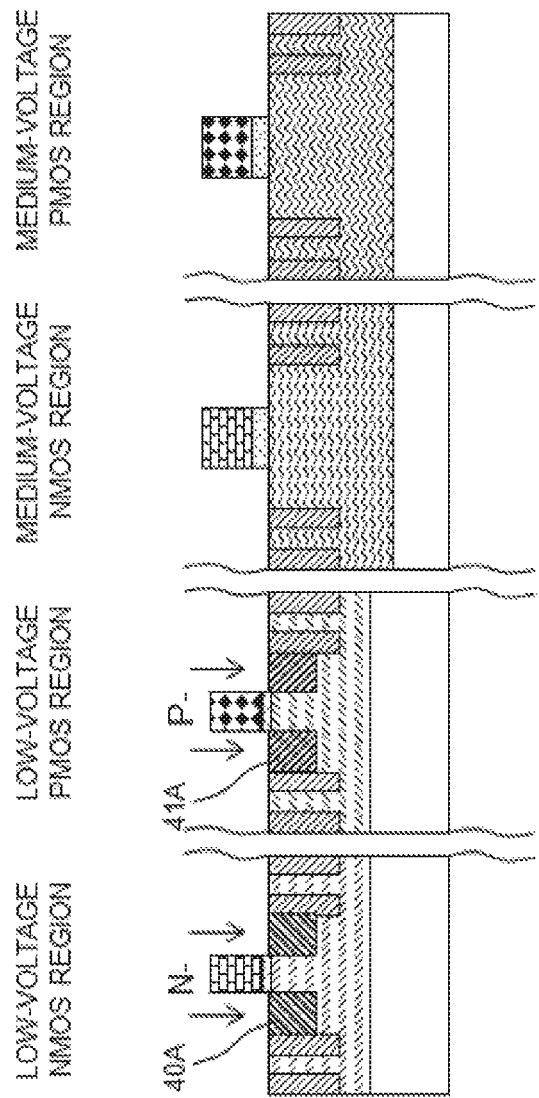
FIG. 32 is across-sectional view illustrating main parts of the semiconductor substrate of a medium-voltage MOS region and a low-voltage MOS region in a process of manufacturing a semiconductor device subsequently to FIG. 31.

Subsequently, as shown in FIG. 32, an n⁻-type semiconductor region 40A is formed in a low-voltage NMOS formation region by the lithography process, the ion implantation method, and the like, and next, a p⁻-type semiconductor region 41A is formed in a low-voltage PMOS formation region by the lithography process, the ion implantation method, and the like.

Figure 33:
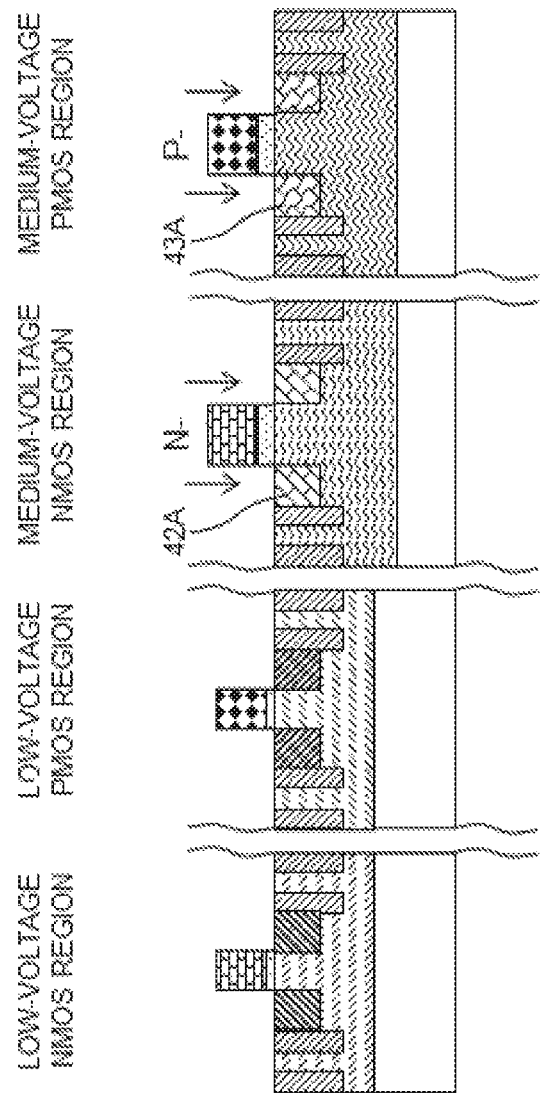
FIG. 33 is across-sectional view illustrating main parts of the semiconductor substrate of a medium-voltage MOS region and a low-voltage MOS region in a process of manufacturing a semiconductor device subsequently to FIG. 32.

Similarly, as shown in FIG. 33, an n⁻-type semiconductor region 42A is formed in a medium-voltage NMOS formation region by the lithography process, the ion implantation method, and the like, and next, a p⁻-type semiconductor region 43A is formed in a medium-voltage PMOS formation region by the lithography process, the ion implantation method, and the like.

Figure 34:
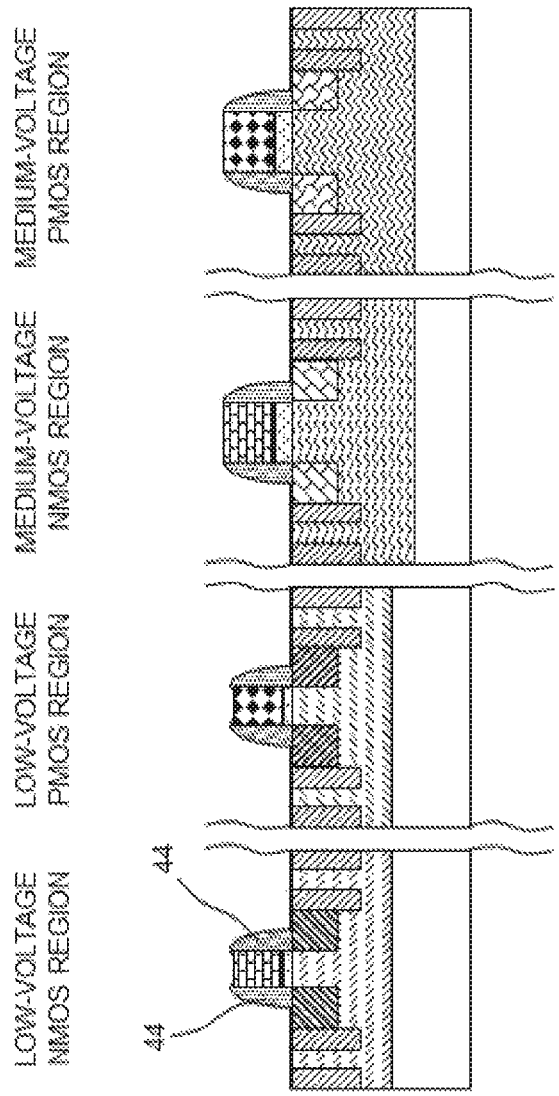
FIG. 34 is across-sectional view illustrating main parts of the semiconductor substrate of a medium-voltage MOS region and a low-voltage MOS region in a process of manufacturing a semiconductor device subsequently to FIG. 33.

A sidewall spacer 44 is formed on the side portions of the gate electrode patterns 38G and 39G (FIG. 34). The sidewall spacer 44 may be formed by depositing an insulating film formed of, for example, a silicon oxide on the main surface of the semiconductor substrate 20 using the CVD method or the like and then etching back the insulating film using anisotropic dry etching.

Figure 35:
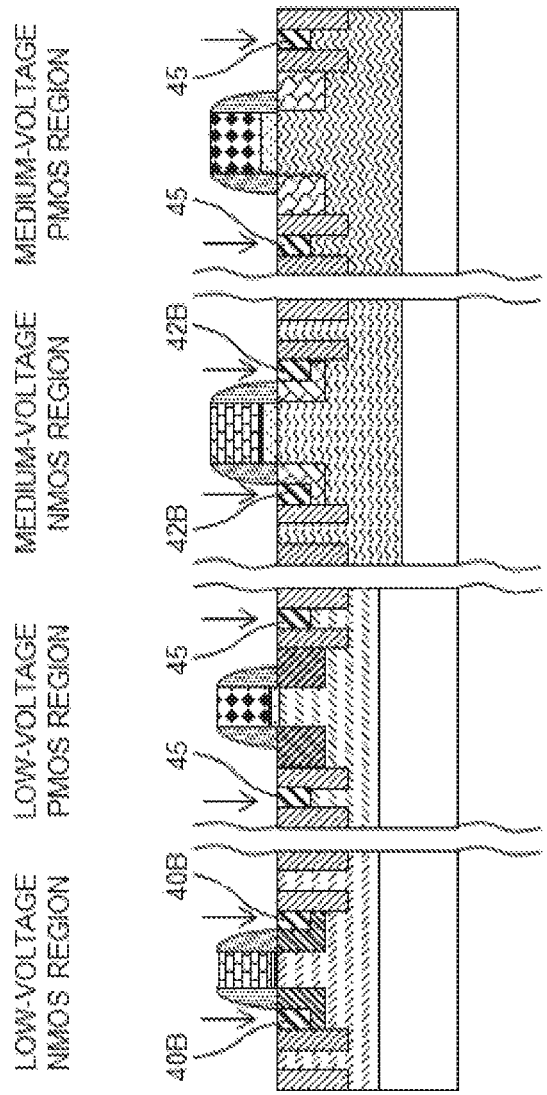
FIG. 35 is across-sectional view illustrating main parts of the semiconductor substrate of a medium-voltage MOS region and a low-voltage MOS region in a process of manufacturing a semiconductor device subsequently to FIG. 34.

Subsequently, as shown in FIG. 35, $n^+$-type semiconductor regions 40B, 42B, and 45 are simultaneously formed in the $n^-$-type semiconductor regions 40A and 42A of a low-voltage NMOS region and a medium-voltage NMOS region, the low-voltage n-well 33, and the medium-voltage n-well 31 by the lithography process, the ion implantation method, and the like. Thereby, an n-type source and drain region having an LDD structure constituted by the semiconductor regions 40A and 40B is formed in the low-voltage NMOS region, and an n-type source and drain region having an LDD structure constituted by the semiconductor regions 42A and 42B is formed in the medium-voltage NMOS region. The $n^+$-type semiconductor region 45 formed in a low-voltage PMOS region and a medium-voltage PMOS region serves as a semiconductor region for feeding power to the wells 33 and 31.

Figure 36:
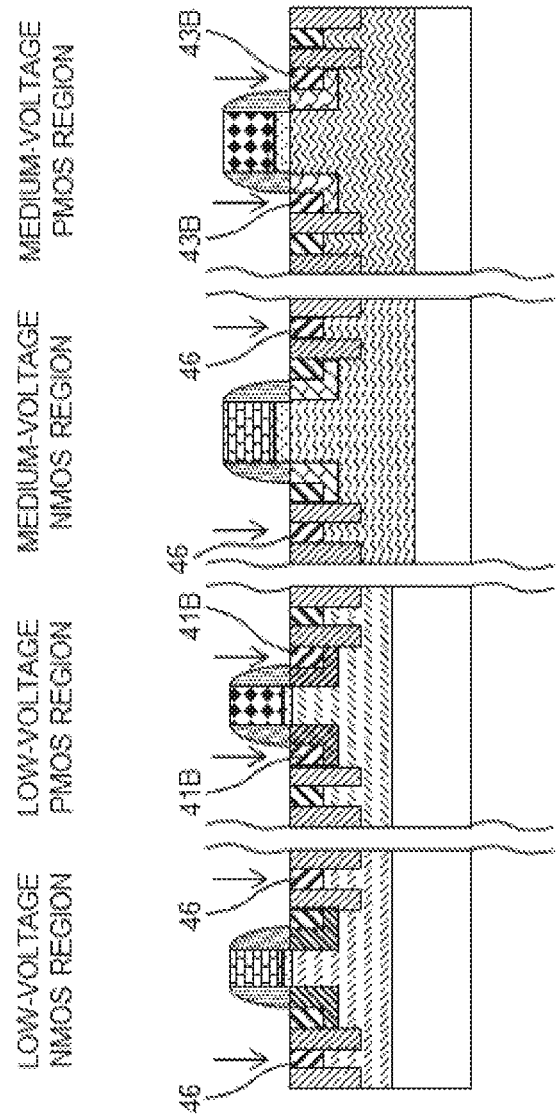
FIG. 36 is across-sectional view illustrating main parts of the semiconductor substrate of a medium-voltage MOS region and a low-voltage MOS region in a process of manufacturing a semiconductor device subsequently to FIG. 35.

Subsequently, as shown in FIG. 36, $p^+$-type semiconductor regions 41B, 43B, and 46 are simultaneously formed in the $p^-$-type semiconductor regions 41A and 43A of the low-voltage PMOS region and the medium-voltage PMOS region, the low-voltage p-well 32, and the medium-voltage p-well 30 by the lithography process, the ion implantation method, and the like. Thereby, a p-type source and drain region having an LDD structure constituted by the semiconductor regions 41A and 41B is formed in the low-voltage PMOS region, and a p-type source and drain region having an LDD structure constituted by the semiconductor regions 43A and 43B is formed in the medium-voltage PMOS region. The $p^+$-type semiconductor region 46 formed in the low-voltage NMOS region and the medium-voltage NMOS region serves as a semiconductor region for feeding power to the wells 32 and 30.

Figure 37:
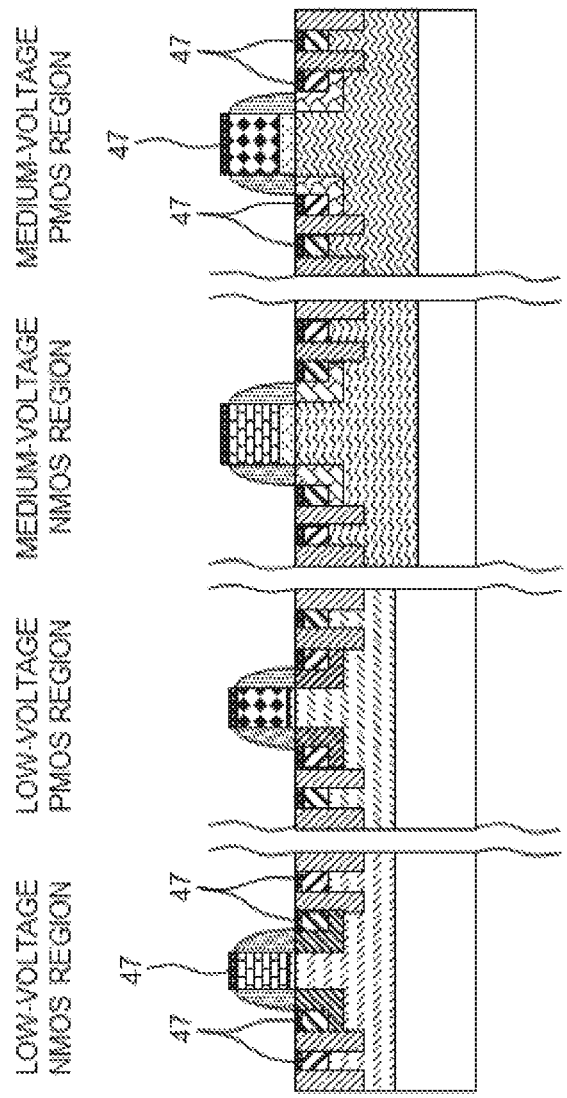
FIG. 37 is across-sectional view illustrating main parts of the semiconductor substrate of a medium-voltage MOS region and a low-voltage MOS region in a process of manufacturing a semiconductor device subsequently to FIG. 36.

Next, as shown in FIG. 37, a silicide layer 47 is selectively formed. Although not shown in the drawing, subsequently, after an insulating layer formed of, for example, a silicon nitride is deposited on the main surface of the semiconductor substrate 20 by the CVD method or the like, an insulating layer formed of, for example, a silicon oxide is deposited thereon to be thick by the CVD method or the like, a chemical mechanical polishing (CMP) process is further performed on the insulating layer, and the upper surface of the insulating layer is planarized. Thereafter, a contact hole is formed in the insulating layer by the lithography process and an etching process. Thereafter, a conductor film formed of, for example, tungsten (W) or the like is deposited on the main surface of the semiconductor substrate 20 by the CVD method or the like, and then a conductor portion is formed within the contact hole by polishing the conductor film using the CMP method or the like. Thereafter, a semiconductor device is completed through a normal wiring formation process, an inspection process and an assembly process.

Next, a method in which thinning is not caused to occur will be described with reference to FIGS. 38 to 53.

Figure 38:
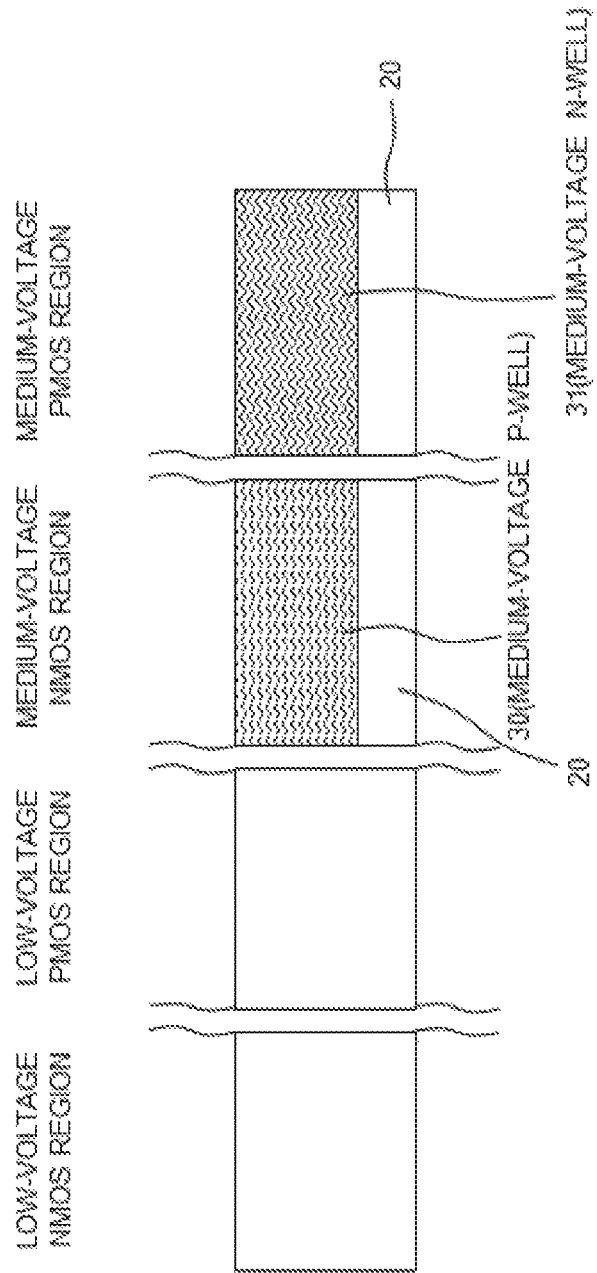
FIG. 38 is across-sectional view illustrating main parts of the semiconductor substrate of a medium-voltage MOS region and a low-voltage MOS region in a process of manufacturing a MOS transistor so as not to cause thinning to occur by forming a separation portion after a gate oxide film is formed.

First, as shown in FIG. 38, a p-type semiconductor substrate 20 is prepared, and a medium-voltage p-type well (medium-voltage p-well) 30 for a medium-voltage NMOS and a medium-voltage n-type well (medium-voltage n-well) 31 for a medium-voltage PMOS are formed on the main surface thereof by a photolithography (hereinafter, simply referred to as lithography) process, am ion implant at ion process, and the like. The lithography process is a series of processes of forming a desired resist pattern through the application, exposure, development and the like of a photoresist (hereinafter, simply referred to as resist) film. In the ion implantation process, a desired impurity is selectively introduced into a desired portion of the semiconductor substrate 20, using the resist pattern formed on the main surface of the semiconductor substrate 20 through the lithography process as a mask. The resist pattern herein is formed of a pattern in which an impurity introduction region is exposed and other regions are covered.

Figure 39:
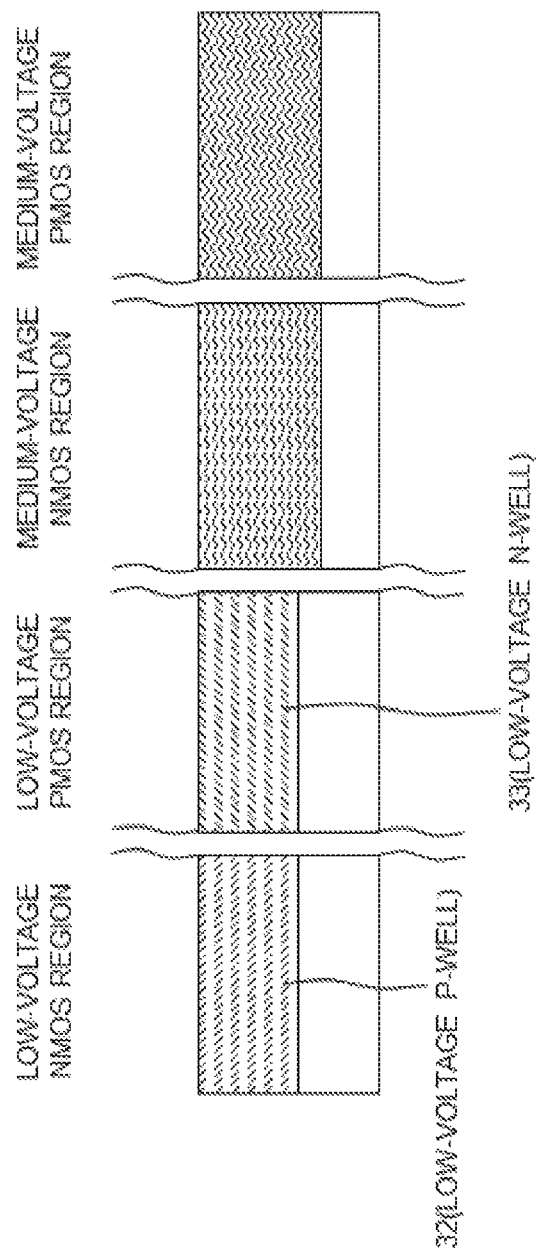
FIG. 39 is across-sectional view illustrating main parts of the semiconductor substrate of a medium-voltage MOS region and a low-voltage MOS region in a process of manufacturing a semiconductor device subsequently to FIG. 38.

Subsequently, as shown in FIG. 39, a low-voltage p-type well (low-voltage p-well) 32 for a low-voltage NMOS and a low-voltage n-type well (low-voltage n-well) 33 for a low-voltage PMOS are formed by the lithography process, the ion implantation process, and the like.

Figure 40:
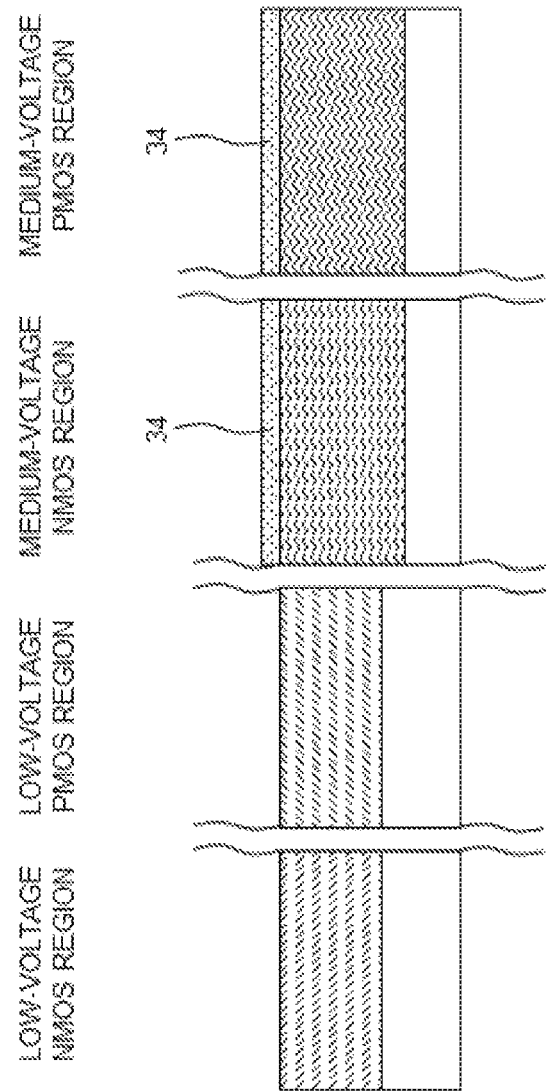
FIG. 40 is across-sectional view illustrating main parts of the semiconductor substrate of a medium-voltage MOS region and a low-voltage MOS region in a process of manufacturing a semiconductor device subsequently to FIG. 39.
Figure 41:
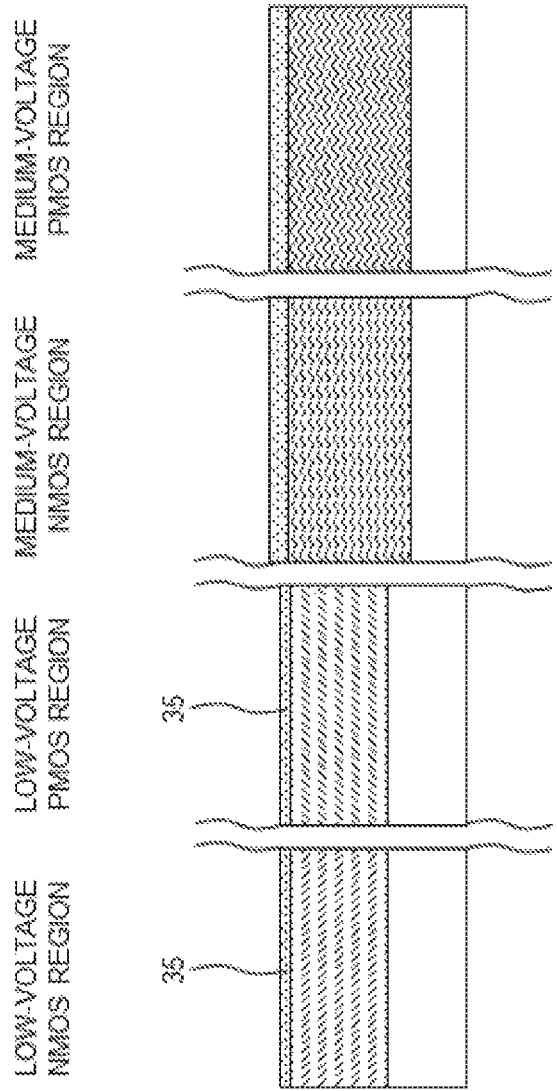
FIG. 41 is across-sectional view illustrating main parts of the semiconductor substrate of a medium-voltage MOS region and a low-voltage MOS region in a process of manufacturing a semiconductor device subsequently to FIG. 40.

Next, a gate oxide film (medium-voltage gate oxide film) 34 for a medium-voltage NMOS and a medium-voltage PMOS is formed only in a medium-voltage MOS region by lithography as shown in FIG. 40, and a gate oxide film (low-voltage gate oxide film) 35 for a low-voltage NMOS and a low-voltage PMOS is formed as shown in FIG. 41. The medium-voltage gate oxide film 34 is formed to be thicker than the low-voltage gate oxide film 35. The gate insulating film 34 has a thickness of 11.5 nm, and the gate insulating film 35 has a thickness of 2 nm. The gate insulating film can also be obtained by laminating an insulating film deposited by a CVD method or the like, in addition to the oxide film formed by the thermal oxidation method.

Figure 42:
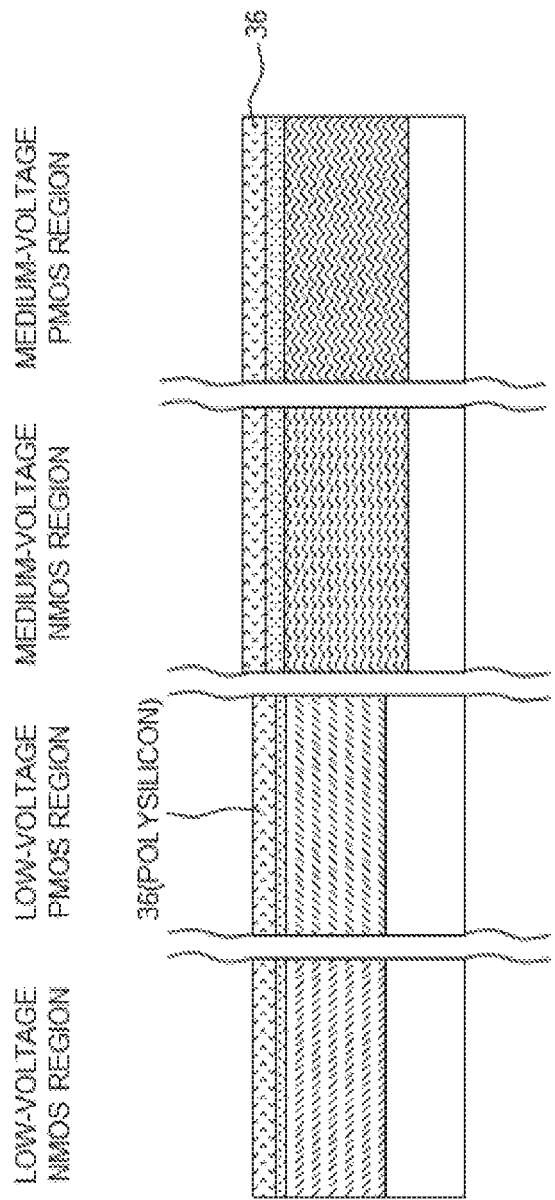
FIG. 42 is across-sectional view illustrating main parts of the semiconductor substrate of a medium-voltage MOS region and a low-voltage MOS region in a process of manufacturing a semiconductor device subsequently to FIG. 41.
Figure 43:
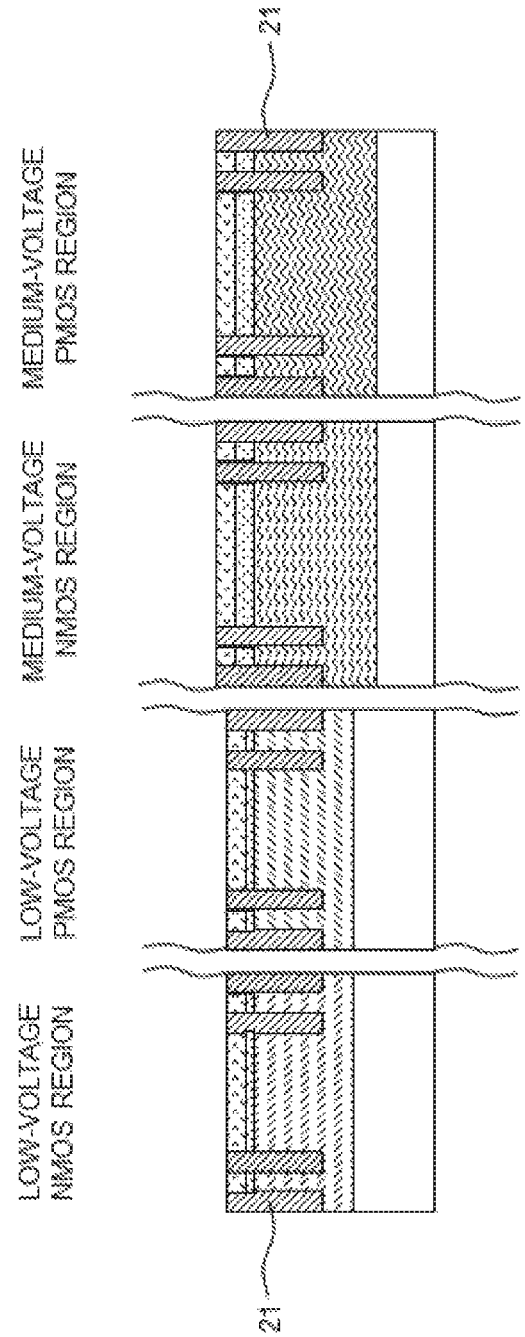
FIG. 43 is across-sectional view illustrating main parts of the semiconductor substrate of a medium-voltage MOS region and a low-voltage MOS region in a process of manufacturing a semiconductor device subsequently to FIG. 42.
Figure 44:
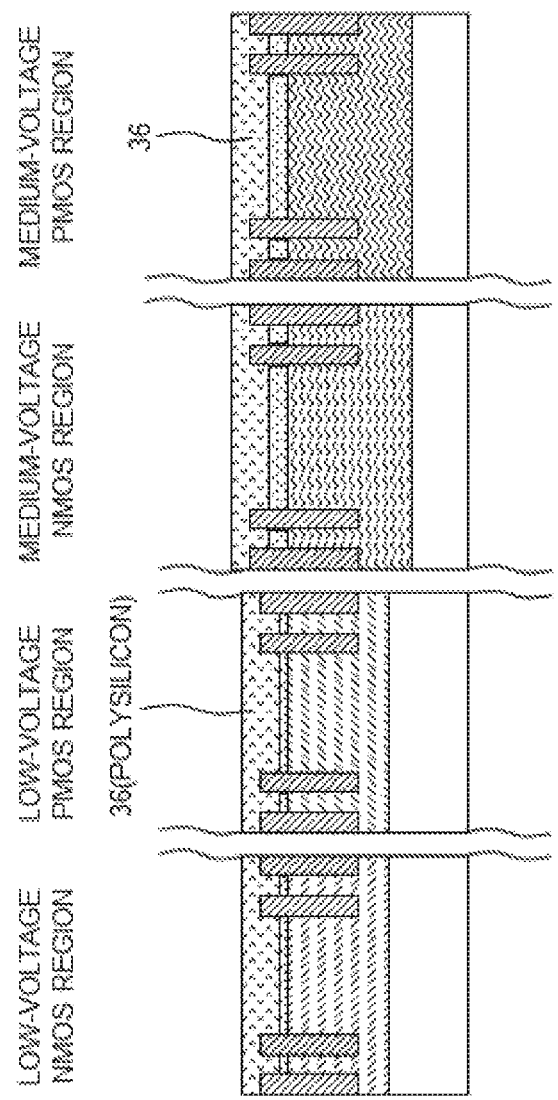
FIG. 44 is across-sectional view illustrating main parts of the semiconductor substrate of a medium-voltage MOS region and a low-voltage MOS region in a process of manufacturing a semiconductor device subsequently to FIG. 43.

As shown in FIG. 42, a conductor film 36 formed of, for example, low-resistance polycrystalline silicon is formed on the main surface of the semiconductor substrate 20 by the chemical vapor deposition (CVD) method or the like. Next, as shown in FIG. 43, an STI 21 is formed as a separation region. An active region is formed in a region defined by STI 21. After the STI 21 is formed, a conductor film 36 formed of polycrystalline silicon is further formed on the surface thereof by the CVD method or the like (FIG. 44).

Figure 45:
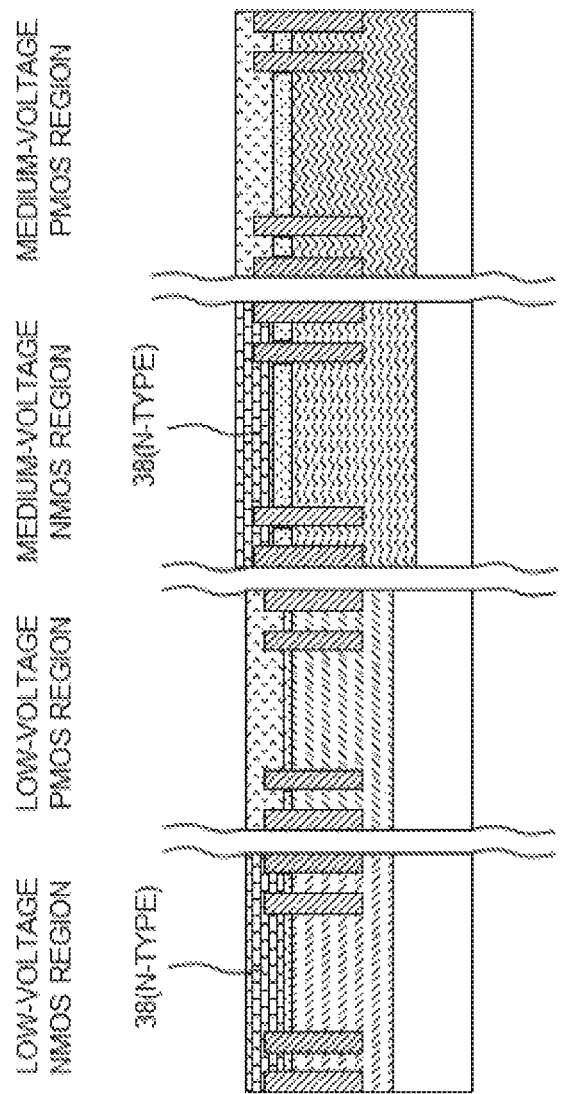
FIG. 45 is across-sectional view illustrating main parts of the semiconductor substrate of a medium-voltage MOS region and a low-voltage MOS region in a process of manufacturing a semiconductor device subsequently to FIG. 44.
Figure 46:
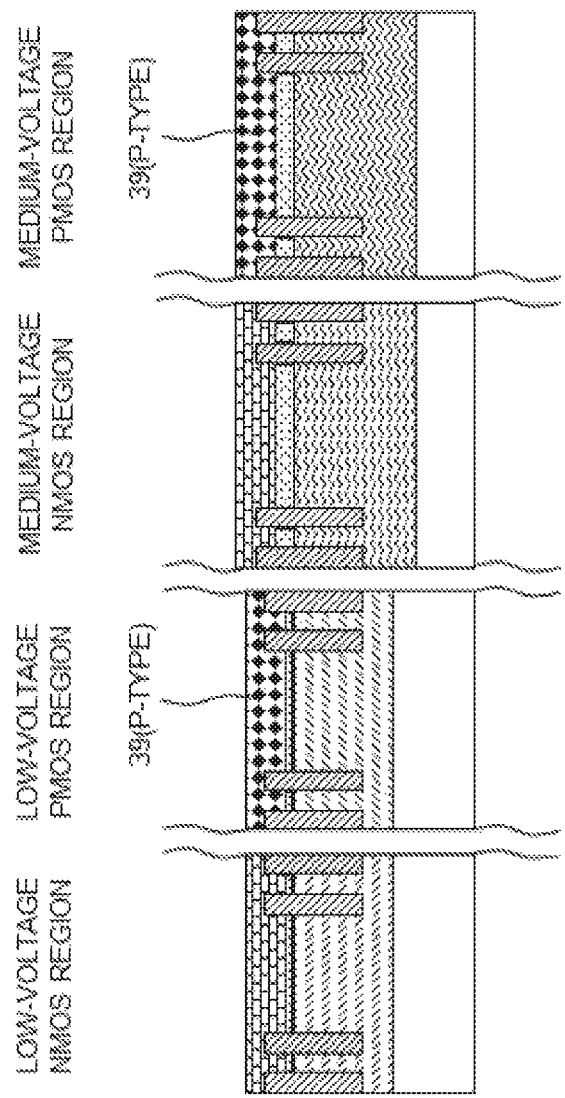
FIG. 46 is a cross-sectional view illustrating main parts of the semiconductor substrate of a medium-voltage MOS region and a low-voltage MOS region in a process of manufacturing a semiconductor device subsequently to FIG. 45.
Figure 47:
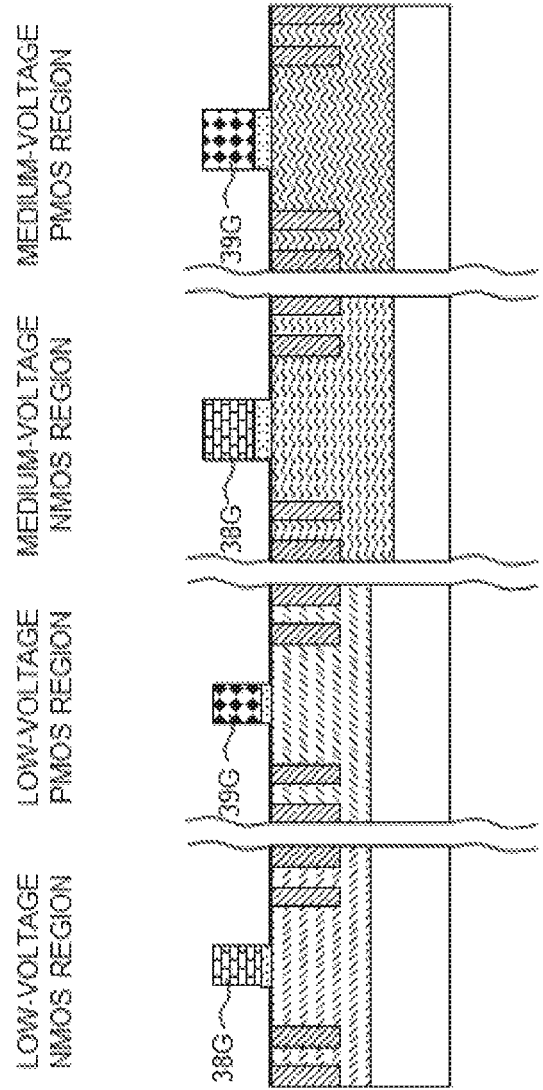
FIG. 47 is a cross-sectional view illustrating main parts of the semiconductor substrate of a medium-voltage MOS region and a low-voltage MOS region in a process of manufacturing a semiconductor device subsequently to FIG. 46.

Thereafter, a conductor film 38 is formed by implanting an n-type impurity into the conductor film 36 for a low-voltage NMOS and a medium-voltage NMOS as shown in FIG. 45, and a conductor film 39 is formed by implanting a p-type impurity into the conductor film 36 for a low-voltage PMOS and a medium-voltage PMOS as shown in FIG. 46. Gate electrode patterns 38G and 39G are formed by the lithography process by processing the conductor films 38 and 39 after the impurity implantation (FIG. 47).

Figure 48:
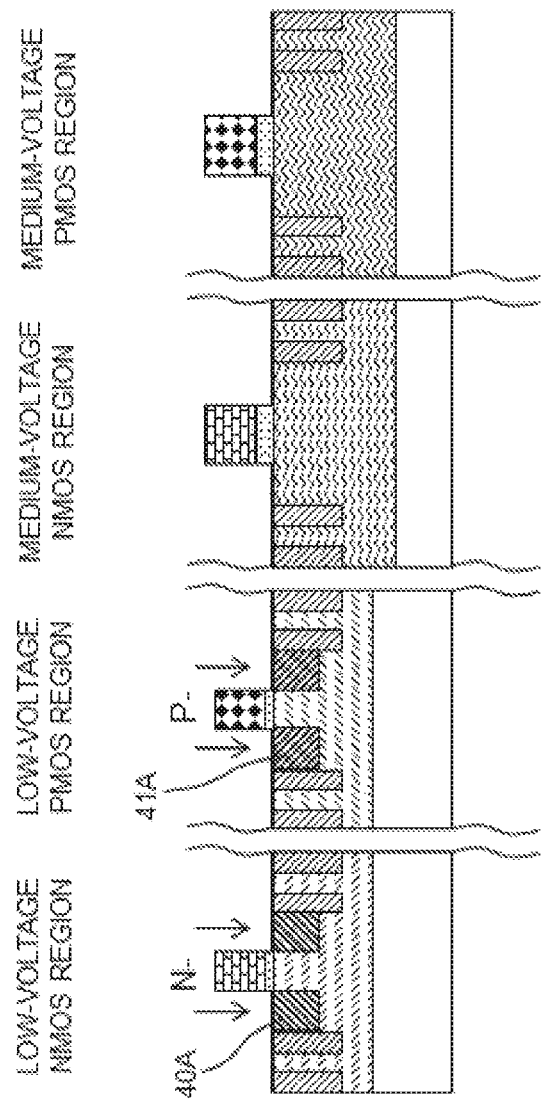
FIG. 48 is a cross-sectional view illustrating main parts of the semiconductor substrate of a medium-voltage MOS region and a low-voltage MOS region in a process of manufacturing a semiconductor device subsequently to FIG. 47.

Subsequently, as shown in FIG. 48, an $n^-$-type semiconductor region 40A is formed in a low-voltage NMOS formation region by the lithography process, the ion implantation method, and the like, and next, a $p^-$-type semiconductor region 41A is formed in a low-voltage PMOS formation region by the lithography process, the ion implantation method, and the like.

Figure 49:
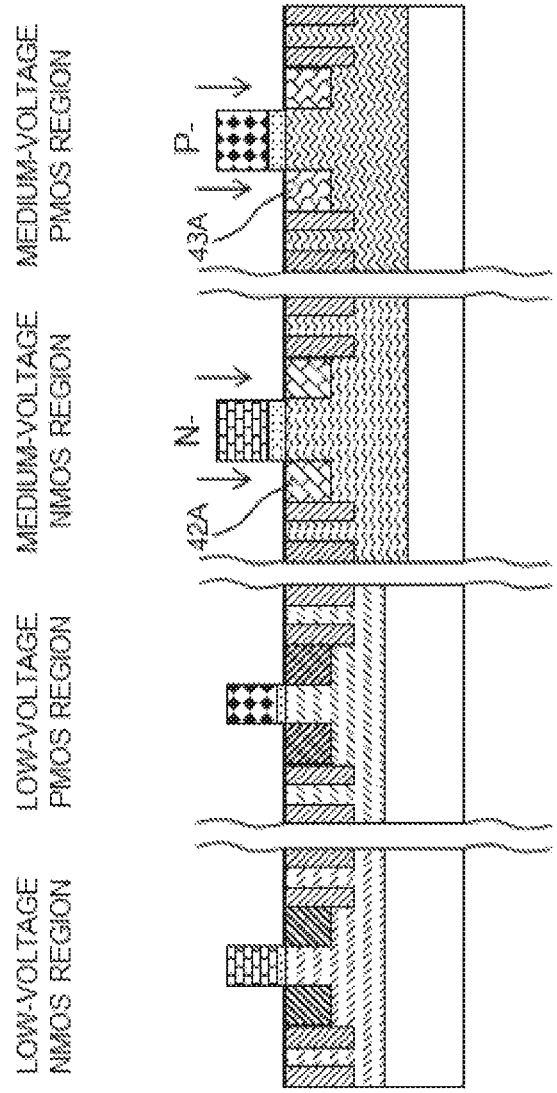
FIG. 49 is a cross-sectional view illustrating main parts of the semiconductor substrate of a medium-voltage MOS region and a low-voltage MOS region in a process of manufacturing a semiconductor device subsequently to FIG. 48.

Similarly, as shown in FIG. 49, an $n^-$-type semiconductor region 42A is formed in a medium-voltage NMOS formation region by the lithography process, the ion implantation method, and the like, and next, a $p^-$-type semiconductor region 43A is formed in a medium-voltage PMOS formation region by the lithography process, the ion implantation method, and the like.

Figure 50:
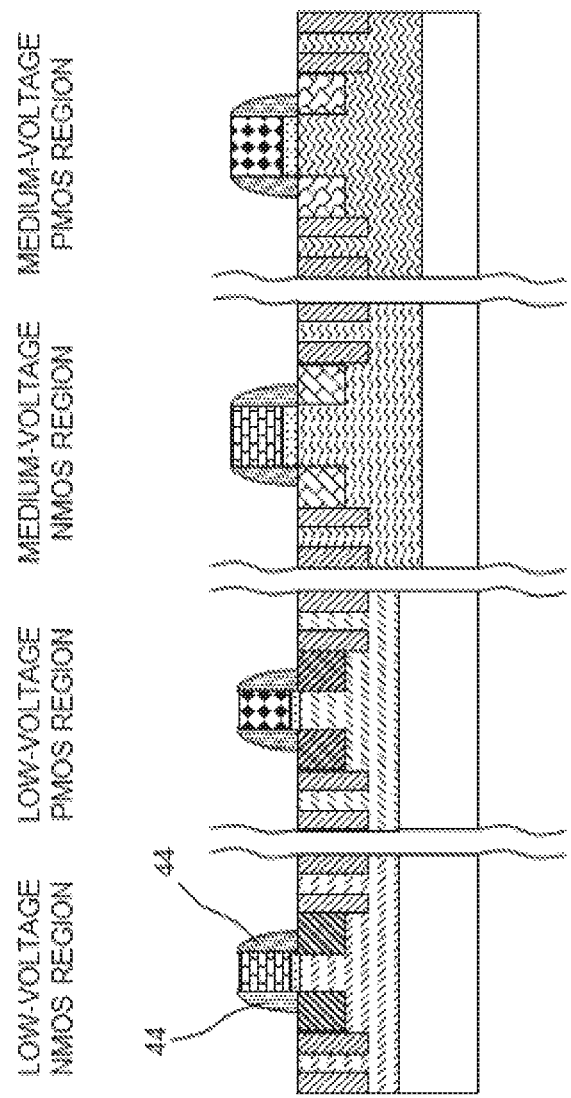
FIG. 50 is a cross-sectional view illustrating main parts of the semiconductor substrate of a medium-voltage MOS region and a low-voltage MOS region in a process of manufacturing a semiconductor device subsequently to FIG. 49.

A sidewall spacer 44 is formed on the side portions of the gate electrode patterns 38G and 39G (FIG. 50).

Figure 51:
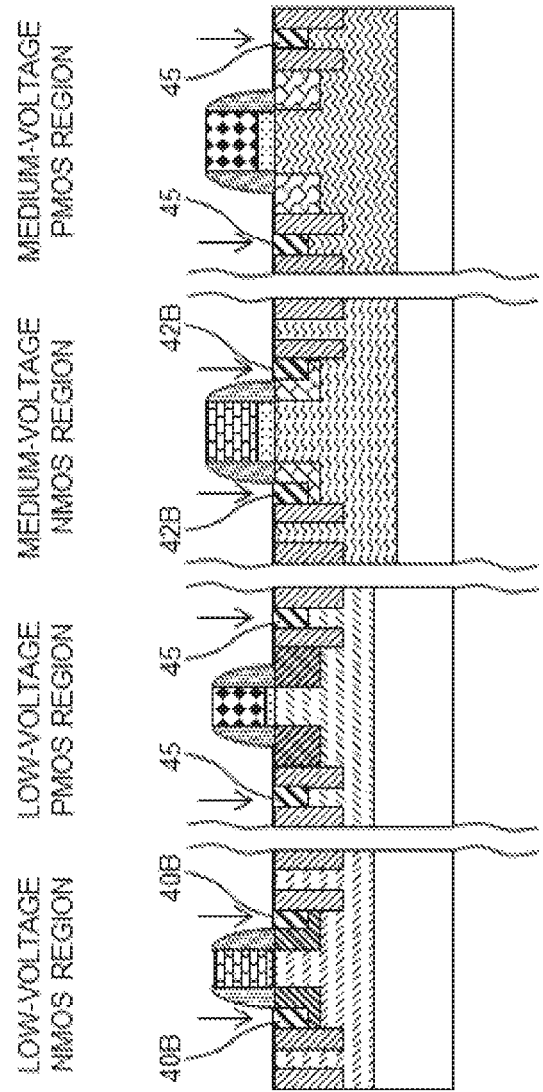
FIG. 51 is a cross-sectional view illustrating main parts of the semiconductor substrate of a medium-voltage MOS region and a low-voltage MOS region in a process of manufacturing a semiconductor device subsequently to FIG. 50.

Subsequently, as shown in FIG. 51, $n^+$-type semiconductor regions 40B, 42B, and 45 are simultaneously formed in the $n^-$-type semiconductor regions 40A and 42A of a low-voltage NMOS region and a medium-voltage NMOS region, the low-voltage n-well 33, and the medium-voltage n-well 31 by the lithography process, the ion implantation method, and the like. Thereby, an n-type source and drain region having an LDD structure constituted by the semiconductor regions 40A and 40B is formed in the low-voltage NMOS region, and an n-type source and drain region having an LDD structure constituted by the semiconductor regions 42A and 42B is formed in the medium-voltage NMOS region. The n$^+$-type semiconductor region 45 formed in a low-voltage PMOS region and a medium-voltage PMOS region serves as a semiconductor region for feeding power to the wells 33 and 31.

Figure 52:
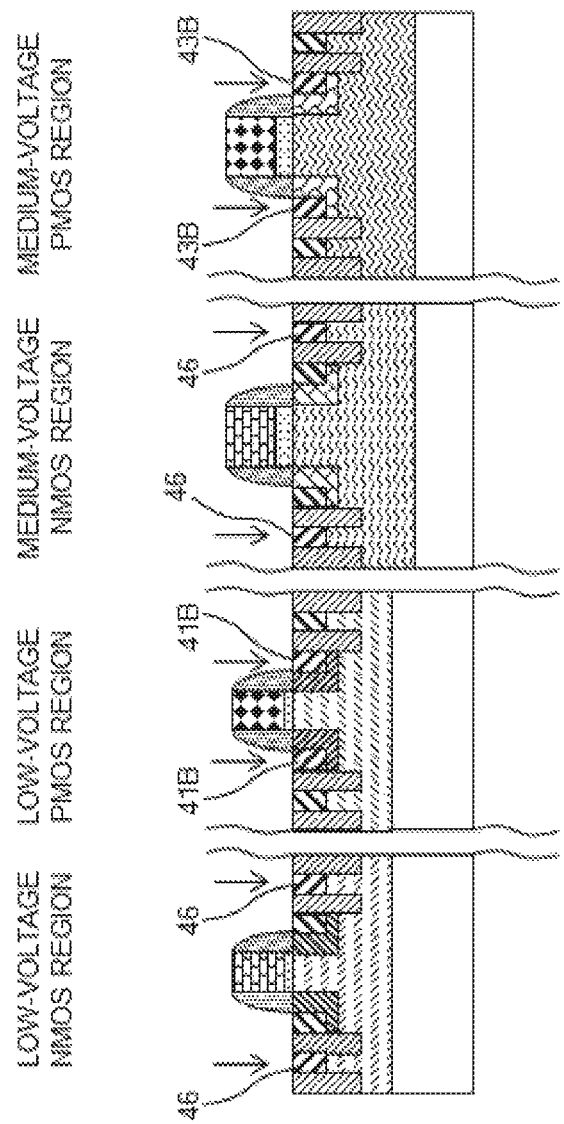
FIG. 52 is a cross-sectional view illustrating main parts of the semiconductor substrate of a medium-voltage MOS region and a low-voltage MOS region in a process of manufacturing a semiconductor device subsequently to FIG. 51.

Subsequently, as shown in FIG. 52, p$^+$-type semiconductor regions 41B, 43B, and 46 are simultaneously formed in the p$^-$-type semiconductor regions 41A and 43A of the low-voltage PMOS region and the medium-voltage PMOS region, the low-voltage p-well 32, and the medium-voltage p-well 30 by the lithography process, the ion implantation method, and the like. Thereby, a p-type source and drain region having an LDD structure constituted by the semiconductor regions 41A and 41B is formed in the low-voltage PMOS region, and a p-type source and drain region having an LDD structure constituted by the semiconductor regions 43A and 43B is formed in the medium-voltage PMOS region. The p$^+$-type semiconductor region 46 formed in the low-voltage NMOS region and the medium-voltage NMOS region serves as a semiconductor region for feeding power to the wells 32 and 30.

Figure 53:
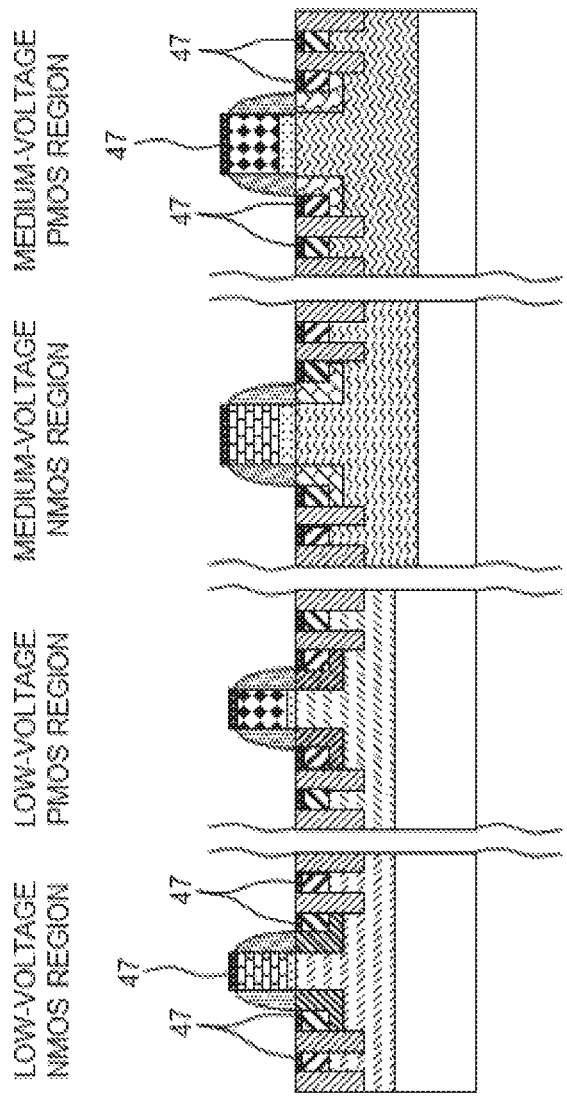
FIG. 53 is a cross-sectional view illustrating main parts of the semiconductor substrate of a medium-voltage MOS region and a low-voltage MOS region in a process of manufacturing a semiconductor device subsequently to FIG. 52.

As shown in FIG. 53, a silicide layer 47 is selectively formed. Although not shown in the drawing, subsequently, an insulating layer is formed and planarized, and a contact hole is formed therein by the lithography process and an etching process. Thereafter, a conductor film formed of, for example, tungsten (W) or the like is deposited on the main surface of the semiconductor substrate 20 by the CVD method or the like, and then a conductor portion is formed within the contact hole by polishing the conductor film. Thereafter, a semiconductor device is completed through a normal wiring formation process, an inspection process and an assembly process.

As described above, while the invention devised by the inventor has been described specifically based on the embodiments thereof, the invention is not limited to the embodiments, and it goes without saying that various changes and modifications may be made without departing from the scope of the invention.

The planar layout configuration of the MOS transistor can be appropriately changed without being limited to a form shown in each drawing. For example, in FIGS. 1, 12, and 18 which are basis forms of the layout pattern, the protrusion amount of the distance Ds2 on both sides in the direction of the gate length in the gate electrode pattern 1 can also be set to zero. That is, the gate electrode pattern may stride over a boundary between an active region and a separation portion, and the minimum value of the protrusion amount Ds2 protruding outside of the boundary may be substantially zero.

In the above embodiment, an example of the n-channel type MOS transistor has been given and the configuration thereof has been described, but it goes without saying that the invention can be applied to the p-channel type MOS transistor. In addition, the invention can be applied to not only a medium-voltage MOS transistor and a low-voltage MOS transistor, but also a high-voltage MOS transistor.

What is claimed is:

1. A semiconductor device, comprising:
   an active region defined by a separation region on a main surface of a semiconductor substrate; and
   a field effect transistor formed in the active region,
   wherein a boundary portion, which a gate electrode pattern overlaps, is disposed in a boundary between the active region and the separation region, the field effect transistor including source and drain regions and a channel region interposed inside the boundary portion in a direction of a gate width and a direction of a gate length, a separation portion being part of the active region and separating the source and drain regions from the boundary portion in the direction of the gate width and the direction of the gate length, wherein the gate electrode pattern partially overlaps the separation region, and is adjacent to but does not overlap the source and drain regions, and wherein a gate oxide film partially underlies the gate electrode pattern and is adjacent to but not overlying the separation region.

2. The semiconductor device according to claim 1, wherein the boundary portion covered with the gate electrode pattern surrounds each of the source and drain regions and the channel region of the field effect transistor formed in the active region from four directions when seen in a plan view, and does not come into contact with each of the source and drain regions.

3. The semiconductor device according to claim 2, wherein the boundary portion surrounds a plurality of field effect transistors, and a portion of each of the surrounded source and drain regions is made to be common between field effect transistors adjacent to each other.

4. The semiconductor device according to claim 1, wherein the boundary portion comes into contact with one source and drain region of the field effect transistor formed in the active region and surrounds the other source and drain region and the channel region from three directions in a plan view, and the other source and drain region does not come into contact with the boundary portion.

5. The semiconductor device according to claim 4, wherein in a state where two of the field effect transistors are set to one unit, each of the source and drain regions on one side is used in common, and each of the source and drain regions on the other side is individualized.

6. A semiconductor device, comprising:
   an active region defined by a separation region on a main surface of a semiconductor substrate; and
   a field effect transistor formed in the active region,
   wherein a boundary portion, over which a gate electrode pattern strides, is disposed in a boundary between the active region and the separation region, the field effect transistor including source and drain regions and a channel region interposed inside the boundary portion at least in a direction of a gate width, a separation portion separating the source and drain regions from the boundary portion,
   wherein the boundary portion over which the gate electrode pattern strides comes into contact with both of a pair of source and drain regions of the field effect transistor formed in the active region, one source and drain region has the separation portion formed between the boundary portion and the region, and a length of the boundary portion from a position at which the boundary portion and the one source and drain region come into contact with each other to a position at which the boundary portion comes into contact with the other source and drain region through the separation portion is larger than a gate length of the field effect transistor,
   wherein a length of the one source and drain region in the direction of the gate width becomes smaller than a length of the other source and drain region in the direction of the gate width, and the boundary portion covered with the gate electrode pattern has the one source and drain region and the channel region of the field effect transistor, formed in the active region, interposed therein in the direction of the gate width.

7. The semiconductor device according to claim 6, wherein in a state where two of the field effect transistors are set to one unit, each of the source and drain regions on the other side is used in common, and each of the source and drain regions on one side is individualized.

8. A semiconductor device, comprising:
an active region defined by a separation region on a main surface of a semiconductor substrate; and
a field effect transistor formed in the active region,
wherein a boundary portion, which a gate electrode pattern overlaps, is disposed in a boundary between the active region and the separation region and is configured such that a length of one side, in a direction of a gate length of the field effect transistor formed in the active region, becomes larger than the gate length, and does not come into contact with at least one of a pair of source and drain regions of the field effect transistor,
wherein a region between the boundary portion and the source and drain regions is part of the active region,
wherein a gate oxide film partially underlies the gate electrode pattern and is adjacent to but not overlying the separation region, and
wherein the gate electrode pattern is adjacent to but does not overlap the source and drain regions.

9. The semiconductor device according to claim 8, wherein the boundary portion is separated from both the source and drain regions of the field effect transistor formed in the active region.

10. The semiconductor device according to claim 9, wherein the field effect transistor is adjacent formed in the active region relating to the boundary portion by using a portion of the source and drain regions and the gate electrode pattern in common.

11. The semiconductor device according to claim 8, wherein the boundary portion comes into contact with one source and drain region of the field effect transistor formed in the active region, and is separated from the other source and drain region.

12. The semiconductor device according to claim 11, wherein in a state where two of the field effect transistors are set to one unit, each of the source and drain regions on one side is used in common.

13. A semiconductor device, comprising:
an active region defined by a separation region on a main surface of a semiconductor substrate; and
a field effect transistor formed in the active region,
wherein a boundary portion, over which a gate electrode pattern strides, is disposed in a boundary between the active region and the separation region and comes into contact with both of a pair of source and drain regions of the field effect transistor formed in the active region, a non-contact length of the boundary portion, not in contact with the source and drain regions and between a first part of the boundary portion that comes into contact with one of the source and drain regions and a second part of the boundary portion that comes into contact with the other source and drain region, becomes larger than a gate length of the field effect transistor,
wherein a length of the one source and drain region in a direction of a gate width becomes smaller than a length of the other source and drain region in the direction of the gate width, and
the one source and drain region comes into contact with the boundary portion through a separation portion which is separated from the boundary portion.

14. The semiconductor device according to claim 13, wherein in a state where two of the field effect transistors are set to one unit, each of the source and drain regions on the other side is used in common, and each of the source and drain regions on one side is individualized.

\* \* \* \* \*